United States Patent
Co et al.

(10) Patent No.: US 9,508,689 B2
(45) Date of Patent: Nov. 29, 2016

(54) ELECTRICAL CONNECTOR BETWEEN DIE PAD AND Z-INTERCONNECT FOR STACKED DIE ASSEMBLIES

(71) Applicant: Invensas Corporation, San Jose, CA (US)

(72) Inventors: Reynaldo Co, Santa Cruz, CA (US); Jeffrey S. Leal, Scotts Valley, CA (US); Suzette K. Pangrle, Cupertino, CA (US); Scott McGrath, Scotts Valley, CA (US); De Ann Eileen Melcher, San Jose, CA (US); Keith L. Barrie, Capitola, CA (US); Grant Villavicencio, Scotts Valley, CA (US); Elmer M. Del Rosario, San Jose, CA (US); John R. Bray, San Jose, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 14/871,185

(22) Filed: Sep. 30, 2015

(65) Prior Publication Data

US 2016/0027761 A1   Jan. 28, 2016

Related U.S. Application Data

(63) Continuation of application No. 13/109,996, filed on May 17, 2011, now Pat. No. 9,153,517.

(60) Provisional application No. 61/395,987, filed on May 19, 2010.

(51) Int. Cl.
*H01L 25/065* (2006.01)
*H01L 23/31* (2006.01)
(Continued)

(52) U.S. Cl.
CPC ....... *H01L 25/0657* (2013.01); *H01L 21/6836* (2013.01); *H01L 21/78* (2013.01); *H01L23/3171* (2013.01); *H01L 23/3185* (2013.01); *H01L 23/3192* (2013.01); *H01L 24/03* (2013.01); *H01L 24/05* (2013.01);
(Continued)

(58) Field of Classification Search
CPC ....................................................... H01L 21/78
See application file for complete search history.

(56) References Cited

U.S. PATENT DOCUMENTS

| 4,323,914 A | 4/1982 | Berndlmaier et al. |
| 4,336,551 A | 6/1982 | Fujita et al. |

(Continued)

FOREIGN PATENT DOCUMENTS

| CN | 2512114 Y | 9/2002 |
| CN | 1531069 A | 9/2004 |

(Continued)

OTHER PUBLICATIONS

International Search Report for Application No. PCT/US2009/067386 dated Jul. 1, 2010.

(Continued)

*Primary Examiner* — Yu-Hsi D Sun
(74) *Attorney, Agent, or Firm* — Lerner, David, Littenberg, Krumholz & Mentlik, LLP

(57) ABSTRACT

Methods for forming connectors on die pads at a wafer level of processing include forming spots of a curable electrically conductive material over die pads and extending to or over the interconnect die edge; curing the conductive material; and in a wafer cutting procedure thereafter severing the spots. Also, die pad to z-interconnect connectors formed by the methods, and shaped and dimensioned accordingly. Also, stacked die assemblies and stacked die packages containing die prepared according to the methods and having die pad to z-interconnect connectors formed by the methods and shaped and dimensioned accordingly.

18 Claims, 12 Drawing Sheets

(51) Int. Cl.
  *H01L 23/00* (2006.01)
  *H01L 21/683* (2006.01)
  *H01L 25/00* (2006.01)
  *H01L 21/78* (2006.01)

(52) U.S. Cl.
  CPC .............. *H01L 24/18* (2013.01); *H01L 24/24* (2013.01); *H01L 24/82* (2013.01); *H01L 25/50* (2013.01); *H01L 2221/68327* (2013.01); *H01L 2221/68336* (2013.01); *H01L 2224/0332* (2013.01); *H01L 2224/03318* (2013.01); *H01L 2224/03632* (2013.01); *H01L 2224/03848* (2013.01); *H01L 2224/05016* (2013.01); *H01L 2224/05017* (2013.01); *H01L 2224/0529* (2013.01); *H01L 2224/05553* (2013.01); *H01L 2224/24051* (2013.01); *H01L 2224/24145* (2013.01); *H01L 2224/32145* (2013.01); *H01L 2224/32225* (2013.01); *H01L 2224/73267* (2013.01); *H01L 2224/76155* (2013.01); *H01L 2224/82102* (2013.01); *H01L 2225/06551* (2013.01); *H01L 2225/06562* (2013.01); *H01L 2225/06568* (2013.01); *H01L 2924/01327* (2013.01); *H01L 2924/14* (2013.01)

(56) References Cited

U.S. PATENT DOCUMENTS

| | | |
|---|---|---|
| 4,363,076 A | 12/1982 | McIver |
| 4,500,905 A | 2/1985 | Shibata |
| 4,784,972 A | 11/1988 | Hatada |
| 5,107,325 A | 4/1992 | Nakayoshi |
| 5,138,438 A | 8/1992 | Masayuki et al. |
| 5,200,362 A | 4/1993 | Lin et al. |
| 5,218,234 A | 6/1993 | Thompson et al. |
| 5,311,401 A | 5/1994 | Gates, Jr. et al. |
| 5,331,591 A | 7/1994 | Clifton |
| 5,334,872 A | 8/1994 | Ueda et al. |
| 5,434,745 A | 7/1995 | Shokrgozar et al. |
| 5,466,634 A | 11/1995 | Beilstein, Jr. et al. |
| 5,538,758 A | 7/1996 | Beach et al. |
| 5,571,754 A | 11/1996 | Bertin et al. |
| 5,616,953 A | 4/1997 | King et al. |
| 5,629,566 A | 5/1997 | Doi et al. |
| 5,675,180 A | 10/1997 | Pedersen et al. |
| 5,691,248 A | 11/1997 | Cronin et al. |
| 5,698,895 A | 12/1997 | Pedersen et al. |
| 5,716,759 A | 2/1998 | Badehi |
| 5,721,151 A | 2/1998 | Padmanabhan et al. |
| 5,731,631 A | 3/1998 | Yama et al. |
| 5,737,191 A | 4/1998 | Horiuchi et al. |
| 5,870,351 A | 2/1999 | Ladabaum et al. |
| 5,879,965 A | 3/1999 | Jiang et al. |
| 5,891,761 A | 4/1999 | Vindasius et al. |
| 5,910,687 A | 6/1999 | Chen et al. |
| 5,946,545 A | 8/1999 | Bertin et al. |
| 5,965,947 A | 10/1999 | Nam et al. |
| 6,030,854 A | 2/2000 | Mashimoto et al. |
| 6,034,438 A | 3/2000 | Petersen |
| 6,087,716 A | 7/2000 | Ikeda |
| 6,107,164 A | 8/2000 | Ohuchi |
| 6,175,158 B1 | 1/2001 | Degani et al. |
| 6,225,689 B1 | 5/2001 | Moden et al. |
| 6,228,686 B1 | 5/2001 | Smith et al. |
| 6,255,726 B1 | 7/2001 | Vindasius et al. |
| 6,262,476 B1 | 7/2001 | Vidal |
| 6,271,598 B1 | 8/2001 | Vindasius et al. |
| 6,297,657 B1 | 10/2001 | Thiessen et al. |
| 6,303,977 B1 | 10/2001 | Schroen et al. |
| 6,315,856 B1 | 11/2001 | Asagiri et al. |
| 6,326,244 B1 | 12/2001 | Brooks et al. |
| 6,326,689 B1 | 12/2001 | Thomas |
| 6,338,980 B1 | 1/2002 | Satoh |
| 6,351,030 B2 | 2/2002 | Havens et al. |
| 6,472,746 B2 | 10/2002 | Taniguchi et al. |
| 6,476,467 B2 | 11/2002 | Nakamura et al. |
| 6,569,709 B2 | 5/2003 | Derderian |
| D475,981 S | 6/2003 | Michii |
| 6,580,165 B1 | 6/2003 | Singh |
| 6,582,992 B2 | 6/2003 | Poo et al. |
| 6,593,648 B2 | 7/2003 | Emoto |
| 6,607,938 B2 | 8/2003 | Kwon et al. |
| 6,607,941 B2 | 8/2003 | Prabhu et al. |
| 6,621,155 B1 | 9/2003 | Perino et al. |
| 6,621,172 B2 | 9/2003 | Nakayama et al. |
| 6,624,505 B2 | 9/2003 | Badehi |
| 6,656,827 B1 | 12/2003 | Tsao et al. |
| 6,667,543 B1 | 12/2003 | Chow et al. |
| 6,670,701 B2 | 12/2003 | Matsuura et al. |
| 6,674,159 B1 | 1/2004 | Peterson et al. |
| 6,686,655 B2 | 2/2004 | Moden et al. |
| 6,706,971 B2 | 3/2004 | Albert et al. |
| 6,722,213 B2 | 4/2004 | Offen et al. |
| 6,730,997 B2 | 5/2004 | Beyne et al. |
| 6,737,743 B2 | 5/2004 | Urakawa |
| 6,747,348 B2 | 6/2004 | Jeung et al. |
| 6,750,547 B2 | 6/2004 | Jeung et al. |
| 6,756,252 B2 | 6/2004 | Nakanishi |
| 6,777,767 B2 | 8/2004 | Badehi |
| 6,802,446 B2 | 10/2004 | Chaudhuri et al. |
| 6,844,623 B1 | 1/2005 | Peterson et al. |
| 6,849,802 B2 | 2/2005 | Song et al. |
| 6,908,784 B1 | 6/2005 | Farnworth et al. |
| 6,910,268 B2 | 6/2005 | Miller |
| 6,940,022 B1 | 9/2005 | Vinciarelli et al. |
| 6,956,283 B1 | 10/2005 | Peterson |
| 6,964,915 B2 | 11/2005 | Farnworth et al. |
| 6,972,480 B2 | 12/2005 | Zilber et al. |
| 6,973,718 B2 | 12/2005 | Sheppard, Jr. et al. |
| 6,984,885 B1 | 1/2006 | Harada et al. |
| 7,005,324 B2 | 2/2006 | Imai |
| 7,029,949 B2 | 4/2006 | Farnworth et al. |
| 7,061,125 B2 | 6/2006 | Cho et al. |
| 7,115,986 B2 | 10/2006 | Moon et al. |
| 7,180,168 B2 | 2/2007 | Imai |
| 7,190,060 B1 | 3/2007 | Chiang |
| 7,196,262 B2 | 3/2007 | Gronet |
| 7,208,335 B2 | 4/2007 | Boon et al. |
| 7,208,345 B2 | 4/2007 | Meyer et al. |
| 7,215,018 B2 | 5/2007 | Vindasius et al. |
| 7,221,051 B2 | 5/2007 | Ono et al. |
| 7,245,021 B2 | 7/2007 | Vindasius et al. |
| 7,259,455 B2 | 8/2007 | Seto |
| 7,279,363 B2 | 10/2007 | Cherukuri et al. |
| 7,285,865 B2 | 10/2007 | Kwon et al. |
| 7,335,533 B2 | 2/2008 | Derderian |
| 7,355,274 B2 | 4/2008 | Lim |
| 7,358,154 B2 * | 4/2008 | Poo .......................... H01L 21/78 257/E21.484 |
| 7,405,138 B2 * | 7/2008 | Ohuchi ............... H01L 23/3114 257/528 |
| 7,408,243 B2 | 8/2008 | Shiffer |
| 7,452,743 B2 | 11/2008 | Oliver et al. |
| 7,514,350 B2 | 4/2009 | Hashimoto |
| 7,521,288 B2 | 4/2009 | Arai et al. |
| 7,535,109 B2 | 5/2009 | Robinson et al. |
| 7,564,142 B2 | 7/2009 | Hashimoto |
| 7,595,222 B2 | 9/2009 | Shimoishizaka et al. |
| 7,601,039 B2 | 10/2009 | Eldridge et al. |
| 7,638,869 B2 | 12/2009 | Irsigler et al. |
| 7,662,670 B2 | 2/2010 | Noma et al. |
| 7,662,671 B2 | 2/2010 | Saeki |
| 7,704,794 B2 | 4/2010 | Mess et al. |
| 7,732,912 B2 | 6/2010 | Damberg |
| 7,768,795 B2 | 8/2010 | Sakurai et al. |
| 7,829,438 B2 | 11/2010 | Haba et al. |
| 7,863,159 B2 | 1/2011 | Co et al. |
| 7,888,185 B2 | 2/2011 | Corisis et al. |
| 7,901,989 B2 | 3/2011 | Haba et al. |
| 7,919,846 B2 | 4/2011 | Hembree |
| 7,923,349 B2 | 4/2011 | McElrea et al. |
| 7,952,195 B2 | 5/2011 | Haba |
| 8,022,527 B2 | 9/2011 | Haba et al. |

(56) References Cited

U.S. PATENT DOCUMENTS

| | | |
|---|---|---|
| 8,076,788 B2 | 12/2011 | Haba et al. |
| 8,178,978 B2 | 5/2012 | McElrea et al. |
| 2001/0012725 A1 | 8/2001 | Maeda et al. |
| 2001/0031548 A1 | 10/2001 | Elenius et al. |
| 2001/0042906 A1 | 11/2001 | Nakamura et al. |
| 2002/0006686 A1 | 1/2002 | Cloud et al. |
| 2002/0027257 A1 | 3/2002 | Kinsman et al. |
| 2002/0045290 A1 | 4/2002 | Ball |
| 2002/0096349 A1 | 7/2002 | Hedler et al. |
| 2002/0127775 A1 | 9/2002 | Haba et al. |
| 2002/0168798 A1 | 11/2002 | Glenn et al. |
| 2002/0180010 A1 | 12/2002 | Tsubosaki et al. |
| 2002/0185725 A1 | 12/2002 | Moden et al. |
| 2002/0187260 A1 | 12/2002 | Sheppard et al. |
| 2002/0190368 A1 | 12/2002 | Shimoe et al. |
| 2003/0038353 A1 | 2/2003 | Derderian |
| 2003/0038356 A1 | 2/2003 | Derderian |
| 2003/0038357 A1 | 2/2003 | Derderian |
| 2003/0060034 A1 | 3/2003 | Beyne et al. |
| 2003/0071338 A1 | 4/2003 | Jeung et al. |
| 2003/0071341 A1 | 4/2003 | Jeung et al. |
| 2003/0080403 A1 | 5/2003 | Jeung et al. |
| 2003/0092326 A1 | 5/2003 | Nishikawa et al. |
| 2003/0096454 A1 | 5/2003 | Poo et al. |
| 2003/0099085 A1 | 5/2003 | Duva |
| 2003/0122243 A1 | 7/2003 | Lee et al. |
| 2003/0143819 A1 | 7/2003 | Hedler et al. |
| 2003/0148597 A1 | 8/2003 | Tan et al. |
| 2003/0162369 A1 | 8/2003 | Kobayashi |
| 2003/0209772 A1 | 11/2003 | Prabhu |
| 2004/0014309 A1 | 1/2004 | Nakanishi |
| 2004/0113283 A1 | 6/2004 | Farnworth et al. |
| 2004/0142509 A1 | 7/2004 | Imai |
| 2004/0150095 A1 | 8/2004 | Fraley et al. |
| 2004/0173892 A1 | 9/2004 | Nakanishi |
| 2004/0195667 A1 | 10/2004 | Karnezos |
| 2004/0198033 A1 | 10/2004 | Lee et al. |
| 2004/0212083 A1 | 10/2004 | Yang |
| 2004/0217446 A1 | 11/2004 | Headley et al. |
| 2004/0227235 A1 | 11/2004 | Hashimoto |
| 2004/0238933 A1 | 12/2004 | Chen et al. |
| 2004/0251520 A1 | 12/2004 | Sasaki et al. |
| 2004/0262035 A1 | 12/2004 | Ko et al. |
| 2005/0013927 A1 | 1/2005 | Yamazaki |
| 2005/0067680 A1 | 3/2005 | Boon et al. |
| 2005/0067694 A1 | 3/2005 | Pon et al. |
| 2005/0082651 A1 | 4/2005 | Farnworth et al. |
| 2005/0085050 A1 | 4/2005 | Draney et al. |
| 2005/0101039 A1 | 5/2005 | Chen et al. |
| 2005/0104179 A1 | 5/2005 | Zilber et al. |
| 2005/0148160 A1 | 7/2005 | Farnworth et al. |
| 2005/0156323 A1 | 7/2005 | Tokunaga |
| 2005/0230802 A1 | 10/2005 | Vindasius et al. |
| 2005/0248021 A1 | 11/2005 | Morkner |
| 2005/0258530 A1 | 11/2005 | Vindasius et al. |
| 2005/0287705 A1 | 12/2005 | Yang |
| 2005/0287709 A1 | 12/2005 | Lee et al. |
| 2006/0003552 A1 | 1/2006 | Okada |
| 2006/0035408 A1 | 2/2006 | Derderian |
| 2006/0046436 A1 | 3/2006 | Ohuchi et al. |
| 2006/0055050 A1 | 3/2006 | Numata et al. |
| 2006/0068567 A1 | 3/2006 | Beyne et al. |
| 2006/0076690 A1 | 4/2006 | Khandros et al. |
| 2006/0094165 A1 | 5/2006 | Hedler et al. |
| 2006/0097356 A1 | 5/2006 | Fujii et al. |
| 2006/0103000 A1 | 5/2006 | Kurosawa |
| 2006/0121645 A1 | 6/2006 | Ball |
| 2006/0138626 A1 | 6/2006 | Liew et al. |
| 2006/0220262 A1 | 10/2006 | Meyer et al. |
| 2006/0252180 A1 | 11/2006 | Moden et al. |
| 2006/0267173 A1 | 11/2006 | Takiar et al. |
| 2006/0273365 A1 | 12/2006 | Cross et al. |
| 2006/0278971 A1 | 12/2006 | Barnes et al. |
| 2007/0023900 A1 | 2/2007 | Toyoda |
| 2007/0029684 A1 | 2/2007 | Arai et al. |
| 2007/0065987 A1 | 3/2007 | Mess et al. |
| 2007/0102801 A1 | 5/2007 | Ishida et al. |
| 2007/0132082 A1 | 6/2007 | Tang et al. |
| 2007/0158799 A1 | 7/2007 | Chiu et al. |
| 2007/0158807 A1 | 7/2007 | Lu et al. |
| 2007/0170572 A1 | 7/2007 | Liu et al. |
| 2007/0181989 A1 | 8/2007 | Corisis et al. |
| 2007/0187811 A1 | 8/2007 | Arai et al. |
| 2007/0194462 A1 | 8/2007 | Kim et al. |
| 2007/0222054 A1 | 9/2007 | Hembree |
| 2007/0252262 A1 | 11/2007 | Robinson et al. |
| 2007/0284716 A1 | 12/2007 | Vindasius et al. |
| 2008/0083976 A1 | 4/2008 | Haba et al. |
| 2008/0083977 A1 | 4/2008 | Haba et al. |
| 2008/0112150 A1 | 5/2008 | Jones |
| 2008/0150158 A1 | 6/2008 | Chin |
| 2008/0166836 A1 | 7/2008 | Jobetto |
| 2008/0173792 A1 | 7/2008 | Yang et al. |
| 2008/0180242 A1 | 7/2008 | Cottingham |
| 2008/0203566 A1 | 8/2008 | Su |
| 2008/0206915 A1 | 8/2008 | Yamazaki |
| 2008/0208043 A1 | 8/2008 | Smith et al. |
| 2008/0251913 A1 | 10/2008 | Inomata |
| 2008/0251939 A1 | 10/2008 | Chung et al. |
| 2008/0284044 A1 | 11/2008 | Myers |
| 2008/0290493 A1 | 11/2008 | Tsunozaki |
| 2008/0303131 A1 | 12/2008 | McElrea et al. |
| 2008/0308921 A1 | 12/2008 | Kim |
| 2008/0315407 A1 | 12/2008 | Andrews, Jr. et al. |
| 2009/0020887 A1 | 1/2009 | Mizuno et al. |
| 2009/0020889 A1 | 1/2009 | Murayama et al. |
| 2009/0065948 A1 | 3/2009 | Wang |
| 2009/0068790 A1 | 3/2009 | Caskey et al. |
| 2009/0102038 A1 | 4/2009 | Mcelrea et al. |
| 2009/0146137 A1 | 6/2009 | Kim et al. |
| 2009/0160065 A1 | 6/2009 | Haba et al. |
| 2009/0230528 A1 | 9/2009 | McElrea et al. |
| 2009/0316378 A1 | 12/2009 | Haba et al. |
| 2010/0140753 A1 | 6/2010 | Hembree |
| 2010/0140811 A1 | 6/2010 | Leal et al. |
| 2010/0148352 A1 | 6/2010 | Moden |
| 2010/0207277 A1 | 8/2010 | Bauer et al. |
| 2010/0327461 A1 | 12/2010 | Co et al. |
| 2011/0006432 A1 | 1/2011 | Haba et al. |
| 2011/0031629 A1 | 2/2011 | Haba et al. |
| 2011/0033979 A1 | 2/2011 | Haba et al. |
| 2011/0049696 A1 | 3/2011 | Haba et al. |
| 2011/0187007 A1 | 8/2011 | Haba et al. |
| 2011/0248410 A1 | 10/2011 | Avsian et al. |
| 2011/0266684 A1 | 11/2011 | Leal |
| 2012/0061846 A1 | 3/2012 | Rathburn |
| 2012/0080807 A1 | 4/2012 | Haba et al. |
| 2012/0133057 A1 | 5/2012 | Haba et al. |
| 2012/0211878 A1 | 8/2012 | Popovic et al. |
| 2013/0099392 A1 | 4/2013 | McElrea et al. |
| 2013/0119542 A1 | 5/2013 | Oh |
| 2013/0154117 A1 | 6/2013 | Tan et al. |

FOREIGN PATENT DOCUMENTS

| | | |
|---|---|---|
| CN | 1638118 A | 7/2005 |
| CN | 1905148 A | 1/2007 |
| DE | 102004039906 A1 | 8/2005 |
| EP | 1041624 A1 | 10/2000 |
| EP | 1763894 A2 | 3/2007 |
| FR | 2704690 A1 | 11/1994 |
| JP | 07-509104 A | 10/1995 |
| JP | 11-260851 A | 9/1999 |
| JP | 2000269411 A | 9/2000 |
| JP | 2001210782 A | 8/2001 |
| JP | 2003-142518 A | 5/2003 |
| JP | 2003163324 A | 6/2003 |
| JP | 2004-119473 | 4/2004 |
| JP | 2004153130 A | 5/2004 |
| JP | 2004158536 A | 6/2004 |
| JP | 2004-214548 A | 7/2004 |
| JP | 2005005529 A | 1/2005 |
| JP | 2005026564 A | 1/2005 |
| JP | 2006-351793 A | 12/2006 |

(56) References Cited

FOREIGN PATENT DOCUMENTS

| | | | |
|---|---|---|---|
| JP | 2007073803 A | 3/2007 | |
| JP | 2007523482 A | 8/2007 | |
| JP | 2008160119 A | 7/2008 | |
| JP | 2008205453 A | 9/2008 | |
| JP | 2008236688 A | 10/2008 | |
| JP | 2009-026969 | 2/2009 | |
| JP | 2009027039 A | 2/2009 | |
| KR | 20-1994-0004952 | 7/1994 | |
| KR | 10-1999-0008537 | 2/1999 | |
| KR | 20010062722 A | 7/2001 | |
| KR | 20050009036 A | 1/2005 | |
| KR | 20070018057 A | 2/2007 | |
| KR | 100813624 B1 | 3/2008 | |
| KR | 20080045259 A | 5/2008 | |
| KR | 20080069549 A | 7/2008 | |
| KR | 20080091980 | 10/2008 | |
| TW | 475244 | 2/2002 | |
| TW | 200425356 A | 11/2004 | |
| TW | 200504995 A | 2/2005 | |
| TW | 200527549 A | 8/2005 | |
| TW | 200538754 A | 12/2005 | |
| TW | 200605298 A | 2/2006 | |
| TW | 200721471 | 6/2007 | |
| TW | 200913208 A | 3/2009 | |
| TW | 200940570 A | 10/2009 | |
| WO | 9425987 A1 | 11/1994 | |
| WO | 9907015 A1 | 2/1999 | |
| WO | 9909599 A2 | 2/1999 | |
| WO | 0164344 A2 | 9/2001 | |
| WO | 2005081315 A2 | 9/2005 | |
| WO | 2005101492 A2 | 10/2005 | |
| WO | 2009032371 A1 | 3/2009 | |
| WO | 2009052150 A1 | 4/2009 | |
| WO | 2009114670 A2 | 9/2009 | |

OTHER PUBLICATIONS

Written Opinion of the International Searching Authority for Application No. PCT/US2009/067386 dated Jul. 1, 2010.
International Search Report for Application No. PCT/US2010/055472 dated Jul. 27, 2011.
Written Opinion of the International Searching Authority for Application No. No. PCT/US2010/055472 dated Jul. 27, 2011.
U.S. Appl. No. 12/124,097, filed May 20, 2008.
International Search Report and Written Opinion mailed Mar. 23, 2009, International Application No. PCT/US2008/074450.
Office Action mailed Dec. 22, 2006, U.S. Appl. No. 11/016,558.
Amendment filed Jun. 21, 2007 in response to Dec. 22, 2006 Office Action, U.S. Appl. No. 11/016,558.
Final Office Action mailed Jul. 19, 2007, U.S. Appl. No. 11/016,558.
Amendment filed Sep. 19, 2007 in response to Jul. 19, 2007 Office Action, U.S. Appl. No. 11/016,558.
Advisory Action mailed Oct. 10, 2007, U.S. Appl. No. 11/016,558.
Response filed Oct. 19, 2007 to Oct. 10, 2007 Advisory Action, U.S. Appl. No. 11/016,558.
Amendment filed Jan. 22, 2007 in response to Jul. 19, 2007 Office Action, App. No. 11/016,558.
Office Action mailed Mar. 27, 2008, U.S. Appl. No. 11/016,558.
Amendment filed Jun. 27, 2008 in response to Mar. 27, 2008 Office Action, U.S. Appl. No. 11/016,558.
Final Office Action mailed Sep. 15, 2008, U.S. Appl. No. 11/016,558.
Amendment filed Oct. 14, 2008 in response to Sep. 15, 2008 Office Action, U.S. Appl. No. 11/016,558.
Office Action mailed Dec. 15, 2008, U.S. Appl. No. 11/016,558.
Amendment filed Apr. 8, 2009 in response to Dec. 15, 2008 Office Action, U.S. Appl. No. 11/016,558.
Office Action mailed Jul. 15, 2009, U.S. Appl. No. 11/016,558.
Response filed Aug. 5, 2009 in response to Jul. 15, 2009 Office Action, U.S. Appl. No. 11/016,558.
Notice of Allowance mailed Dec. 17, 2009, U.S. Appl. No. 11/016,558.
EP Supplemental Search Report mailed Nov. 5, 2007, EP Application No. 05736129.7.
Office Action mailed Mar. 19, 2008, EP Application No. 05736129.7.
Office Action mailed Jan. 27, 2009, U.S. Appl. No. 11/849,162.
Amendment filed Mar. 27, 2009 in response to Jan. 27, 2009 Office Action, U.S. Appl. No. 11/849,162.
Office Action (Restriction) mailed Jun. 24, 2009, U.S. Appl. No. 11/849,162.
Amendment filed Jul. 8, 2009 in response to Jun. 24, 2009 Office Action, U.S. Appl. No. 11/849,162.
Supplemental Amendement filed Aug. 5, 2009, U.S. Appl. No. 111849,162.
Office Action (Restriction) mailed Oct. 7, 2009, U.S. Appl. No. 11/849,162.
Amendment filed Nov. 9, 2009 in response to Oct. 7, 2009 Office Action, U.S. Appl. No. 11/849,162.
Office Action mailed Jul. 21, 2010, U.S. Appl. No. 11/849,162.
Amendment filed Jan. 21, 2011 in response to Jul. 21, 2010 Office Action, U.S. Appl. No. 11/849,162.
*Ex Parte Quayle* Action mailed 217/06, U.S. Appl. No. 11/090,969.
Amendment A filed Aug. 7, 2006 in response to Feb. 7, 2006 Quayle Action, U.S. Appl. No. 11/090,969.
Notice of Allowability, mailed Oct. 19, 2006, U.S. Appl. No. 11/090,969.
Office Action mailed Aug. 3, 2009, U.S. Appl. No. 11/744,142.
Amendment filed Dec. 3, 2009 in response to Aug. 3, 2009 Office Action, U.S. Appl. No. 11/744,142.
Final Office Action mailed Mar. 18, 2010, U.S. Appl. No. 11/744,142.
Notice of Appeal filed Sep. 16, 2010 in response to Mar. 18, 2010 Office Action, U.S. Appl. No. 11/744,142.
Amendment and RCE filed Mar. 16, 2011 in response to Mar. 18, 2010 Office Action, U.S. Appl. No. 11/744,142.
Office Action mailed Feb. 7, 2006, U.S. Appl. No. 11/097,829.
Amendment A filed Aug. 7, 2006 in response to Feb. 7, 2006 Office Action, U.S. Appl. No. 11/097,829.
EP Supplementary Search Report mailed Jun. 5, 2008, EP App. No. 05735136.3.
Office Action mailed Dec. 31, 2007, U.S. Appl. No. 11/744,153.
Amendment filed Apr. 1, 2008 in response to Dec. 31, 2007 Office Action , U.S. Appl. No. 11/744,153.
Final Office Action mailed Jul. 1, 2010, U.S. Appl. No. 11/744,153.
Amendment filed Oct. 1, 2008 in response to Jul. 1, 2010 Office Action, U.S. Appl. No. 11/744,153.
Advisory Action, mailed Oct. 20, 2008, U.S. Appl. No. 111744,153.
Amendment and RCE filed Nov. 26, 2008 in response to Oct. 20, 2008 Advisory Action, U.S. Appl. No. 11/744,153.
Taiwanese Office Action for Application No. 099136720 dated May 18, 2015.
Japanese Office Action for Application No. 2012-517680 dated Jun. 1, 2015.
Non-Final Office Action for U.S. Appl. No. 12/913,529 dated Dec. 12, 2014.
Advisory Action for U.S. Appl. No. 12/913,529 dated Oct. 21, 2014.
Final Rejection for U.S. Appl. No. 12/913,529 dated Jul. 9, 2014.
Non-Final Office Action for U.S. Appl. No. 12/913,529 dated Dec. 20, 2013.
Chinese Office Action for Application No. 201310240369.5 dated May 28, 2015.
Twainese Office Action for Application No. 10117575 dated Sep. 18, 2015.
Taiwanese Office Action and Search Report for Application No. 099137634 dated Dec. 22, 2015.
International Search Report for PCT Application No. PCT/US2008/065793, mailed Dec. 22, 2008.
International Search Report and Written Opinion for PCT Application No. PCT/US2008/065788, mailed Sep. 30, 2008.
International Search Report & Wrilten Opinion, Application N90. PCT/US2008/066561, dated Dec. 31, 2008.

(56) References Cited

OTHER PUBLICATIONS

Office Action (Restriction) mailed May 24, 2010, U.S. Appl. No. 12/124,097.
Amendment filed Jul. 26, 2010 in response to May 24, 2010 Office Action, U.S. Appl. No. 12/124,097.
Office Action mailed Oct. 14, 2010, U.S. Appl. No. 12/124,097.
Amendment filed Feb. 14, 2011 in response to Oct. 14, 2010 Office Action, U.S. Appl. No. 12/124,097.
Office Action (Restriction) mailed Apr. 20, 2009, U.S. Appl. No. 11/744,142.
Amendment filed May 22, 2009 in response to Apr. 20, 2009 Office Action, U.S. Appl. No. 11/744,142.
Office Action mailed Aug. 3, 2009, U.S. Appl. No. 111744,142.
Amendment filed Dec. 3, 2009 in response to 813109 Office Action, U.S. Appl. No. 11/744,142.
Final Office Action mailed Mar. 18, 2010, U.S. Appl. No. 111744,142.
Amendment and RCE filed Mar. 16, 2011 in response to Mar. 18, 2010 Office Action, U.S. Appl. No. 11/1744,142.
Office Action mailed 217106, U.S. Appl. No. 11/097,829.
Final Office Action mailed 118/07, U.S. Appl. No. 11/097,829.
Amendment filed Jan. 24, 2007 in response to Jan. 8, 2007 Office Action, U.S. Appl. No. 111097,829.
Notice of Allowance, mailed Feb. 12, 2007, U.S. Appl. No. 11/097,829.
Notice to File Corrected Papers, mailed Mar. 30, 2007, U.S. Appl. No. 11/097,829.
Amendment filed May 29, 2007 in response to Mar. 30, 2007 Notice, U.S. Appl. No. 11/097,829.
EP Supplementary Search Report dated Jun. 5, 2008 and mailed Jun. 12, 2008 for EP App. No. 05735136.3.
Amendment filed 4/1108 in response to Dec. 31, 2007 Office Action, U.S. Appl. No. 11/744,153.
Amendment filed 10/1108 in response to Jul. 1, 2010 Office Action, U.S. Appl. No. 111744,153.
Advisory Action, mailed Oct. 20, 2008, U.S. Appl. No. 11/744,153.
Notice of Allowance mailed Feb. 27, 2009, U.S. Appl. No. 11/744,153.
Office Action (Restriction) mailed Oct. 7, 2009, U.S. Appl. No. 12/143,157.
Amendment filed Nov. 9, 2009 in response to Oct. 7, 2009 Office Action, U.S. Appl. No. 12/143,157.
Office Action mailed Dec. 30, 2009, U.S. Appl. No. 12/143,157.
Amendment filed Jun. 30, 2009 in response to Dec. 30, 2009 Office Action, U.S. Appl. No. 12/143,157.
Final Office Action, mailed Aug. 5, 2010, U.S. Appl. No. 12/143,157.
Amendment and RCE filed Feb. 7, 2011 in repsonse to Aug. 5, 2010 Office Action, U.S. Appl. No. 12/143,157.
Office Action mailed Mar. 1, 2011, U.S. Appl. No. 12/143,157.
International Search Report and Writlen Opinion, Appl. No. PCT/US2008/067722, dated Feb. 25, 2009.
Office Action (Restriction) mailed Feb. 4, 2010, U.S. Appl. No. 12/251,624.
Amendment filed Mar. 4, 2010 in response to Feb. 4, 2010 Office Action, U.S. Appl. No. 12/251,624.
Office Action mailed Jun. 9, 2010, U.S. Appl. No. 12/251,624.
Amendment filed Dec. 9, 2010 in response to Jun. 9, 2010 Office Action, U.S. Appl. No. 12/251,624.
Final Office Action mailed Mar. 1, 2011, U.S. Appl. No. 12/251,624.
International Search Report and Written Opinion dated Mar. 17, 2009, App. No. PCT/US2008/079948.
International Search Report and Written Opinion dated Mar. 6, 2009, App. No. PCT/US2008/173365.
Office Action (Restriction) mailed Dec. 28, 2010, U.S. Appl. No. 12/403,175.
Amendment filed Jan. 29, 2010 in response to Dec. 28, 2010 Office Action, U.S. Appl. No. 12/403,175.
International Search Report and Written Opinion dated Oct. 6, 2009 , App. No. PCTIUS2009/36921.
International Search Report and Written Opinion dated Apr. 12, 2010, App. No. PCTIUS2009/55421.
International Search Report and Written Opinion dated Jan. 26, 2011, App. No. PCT/US2010/39639.
Japanese Office Action for Application No. 2010-550853 dated Sep. 18, 2013.
Taiwanese Office Action for Application No. 098108067 dated Dec. 25, 2013.
Chinese Office Action for Application No. 200980149285.2 dated Feb. 28, 2014.
Japanese Office Action for Application No. 2011540873 dated Jan. 22, 2014.
International Search Report and Written Opnion for Application PCT/US2007/021552 dated May 29, 2008.
International Search Report for Application No. PCT/US2009/003643 dated Aug. 28, 2009.
International Search Report and Written Opinion for Application No. PCT/US08/09207 dated Jan. 16, 2009.
Japanese Office Action for Application No. 2012-517680 dated Jul. 25, 2014.
International Search Report for PCT Application No. PCT/US2008/067541 mailed Oct. 27, 2008.
International Preliminary Report on Patentability for Application PCT/US2008/067541 mailed Jan. 7, 2010.
Office Action mailed Dec. 1, 2009, U.S. Appl. No. 12/142,589, titled "Wafer level surface passivation of stackable integrated circuit chips".
Amendment filed Mar. 1, 2010, U.S. Appl. No. 12/142,589, in response to Office Action mailed Dec. 1, 2009.
Taiwanese Office Action for Application No. 098119939 dated Aug. 29, 2014.
Chinese Office Action for Application No. 201080035256.6 dated Jul. 17, 2014.
Chinese Office Action for Application No. 201180031606.6 dated Dec. 11, 2014.
Office Action (Restriction) mailed Jan. 21, 2010, U.S. Appl. No. 12/046,651.
Amendment filed Feb. 22, 2010 in response to Feb. 21, 2010 Office Action, U.S. Appl. No. 12/046,651.
Office Action mailed Aug. 18, 2010, U.S. Appl. No. 12/046,651.
Amendment filed Jan. 18, 2011 in response to Aug. 18, 2010 Office Action, U.S. Appl. No. 12/046,651.
International Search Report for Application No. PCT/US2010/039639 dated Jan. 26, 2011.
Written Opinion of the International Searching Authority for Application No. PCT/US2010/039639 dated Jan. 26, 2011.
Ko, et al. Development of three-dimensional memory die stack packages using polymer insulated sidewall technique, 1999.
Amendment filed Jun. 26, 2010 in response to May 24, 2010 Office Action, U.S. Appl. No. 12/124,097.
Notice of Allowability, mailed Oct. 19, 2006 U.S. Appl. No. 11/090,969.
Final Office Action mailed Jan. 8, 2007, U.S. Appl. No. 11/097,829.
Amendment filed Jan. 24, 2007 in response to Jan. 8, 2007 Office Action, U.S. Appl. No. 11/097,829.
Amendment filed Apr. 11, 2008 in response to Dec. 31, 2007 Office Action, U.S. Appl. No. 11/744,153.
International Search Report and Written Opinion for Application No. PCT/US2009/047389 dated Jan. 14, 2010.
International Search Report and Written Opinion for Application No. PCT/US2010/054325 dated Jul. 28, 2011.

* cited by examiner (first wafer cut prior to wafer thinning)

(wafer thinning prior to first wafer cut;
two coating procedures)

first wafer
cut N-S* thin wafer;
laminate DAF second wafer cut
N-S* wafer cut E-W
(die singulation)

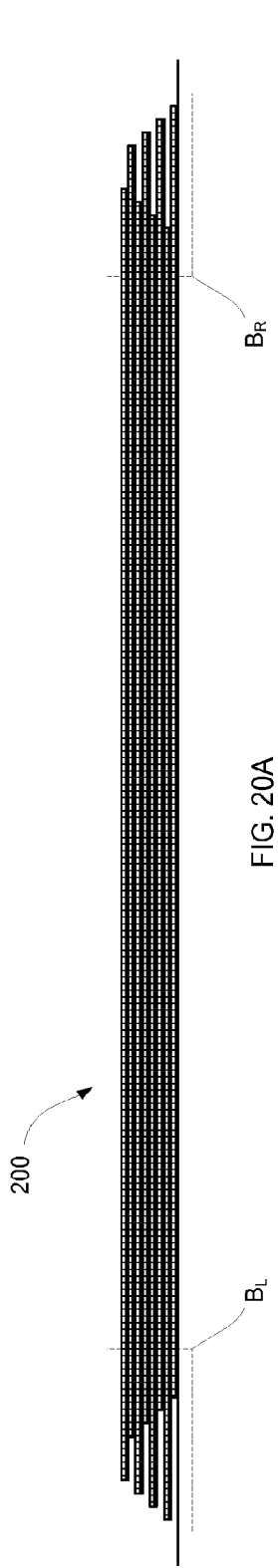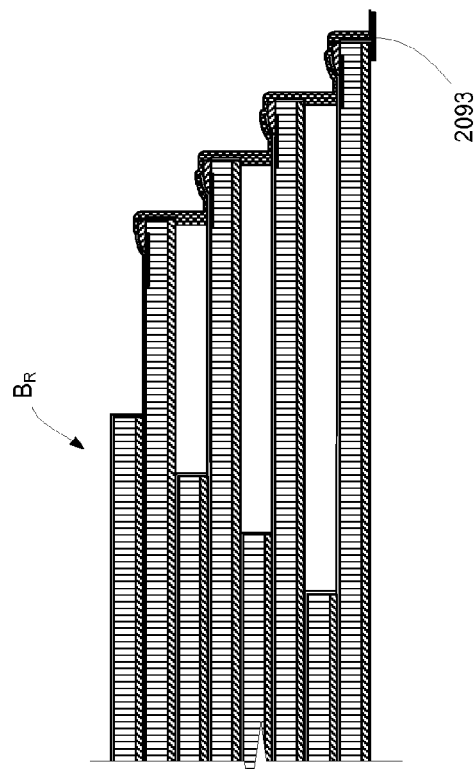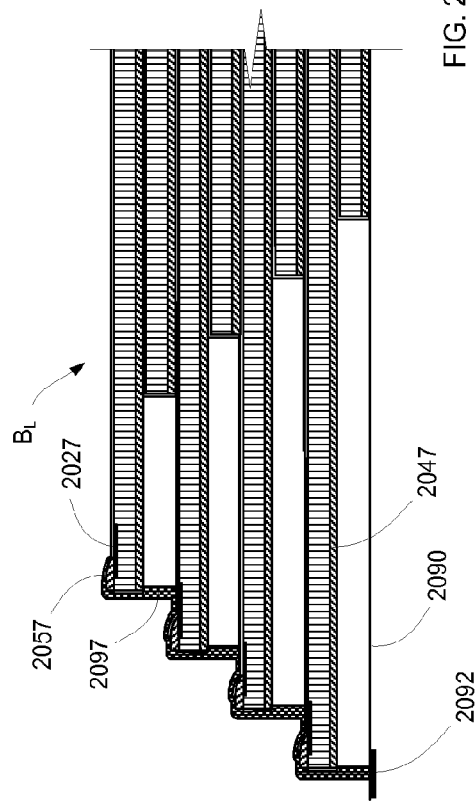

ELECTRICAL CONNECTOR BETWEEN DIE PAD AND Z-INTERCONNECT FOR STACKED DIE ASSEMBLIES

CROSS-REFERENCE TO RELATED APPLICATIONS

This application claims priority from R. Co et al. U.S. Provisional Application No. 61/395,987, titled "Electrical connector between die pad and Z-interconnect for stacked die assemblies", which was filed May 19, 2010, and which is incorporated by reference herein.

This application is related to R. Co et al. U.S. application Ser. No. 12/323,288, filed Nov. 25, 2008, titled "Semiconductor die separation method"; and S. J. S. McElrea et al. U.S. application Ser. No. 12/124,077, filed May 20, 2008, titled "Electrically interconnected stacked die assemblies"; and S. J. S. McElrea et al. U.S. application Ser. No. 12/142,589, filed Jun. 19, 2008, titled "Wafer level surface passivation of stackable integrated circuit chips"; T. Caskey et al. U.S. application Ser. No. 12/124,097, filed May 20, 2008, titled "Electrical interconnect formed by pulse dispense"; and J. Leal U.S. application Ser. No. 12/634,598, filed Dec. 9, 2009, titled "Semiconductor die interconnect formed by aerosol application of electrically conductive material".

BACKGROUND

This invention relates to preparing semiconductor die for electrical interconnection in a stacked die assembly; and to die so prepared and die assemblies containing die so prepared.

Interconnection of die with one another in a stack of die ("die-to-die"; "z-interconnection") or of a die or a die stack with a substrate ("die-to-substrate") presents a number of challenges. For example, the integrated circuitry is situated on an "active side" of the die, and exposed pads are situated on the active side of the die for electrical interconnection with other die or with a substrate. When die are stacked, one die in the stack may obscure the pads on another die, making them inaccessible for interconnection, particularly where die having the same or similar dimensions are stacked one over another.

Some die as provided have die pads along one or more of the die margins, and these may be referred to as peripheral pad die. Other die as provided have die pads arranged in one or two rows near the center of the die, and these may be referred to as center pad die. The die may be "rerouted" to provide a suitable arrangement of interconnect pads at or near one or more of the edges of the die.

A die edge along which interconnect pads are arranged may be referred to as an "interconnect edge"; the margin of the die on the active side adjacent the interconnect edge may be referred to as an "interconnect margin", and the sidewall of the die adjacent the interconnect edge may be referred t as an "interconnect sidewall".

Various kinds of die interconnection have been proposed, including among others flip-chip interconnect, wire bond interconnect, and tab bond interconnect.

Where wire bond interconnect is employed in a stacked die assembly, the wire bonds may be formed to connect pads on the active side of a first die before an additional die is stacked over it. A spacer is typically provided upon the active side of the first die, to prevent interference by the second die with the wire loops on the first die.

Approaches to z-interconnection of die, other than by wire bonds, bumps, or tabs are described, for example, in U.S. Pat. No. 5,675,180 and its progeny; and, for example, in U.S. Pat. No. 7,215,018 and, for example, in U.S. Pat. No. 7,245,021.

Particularly, for example, U.S. Pat. No. 7,245,021 describes "off-die" interconnection, employing interconnection terminals electrically connected to peripheral sites on the die and projecting beyond the die edge; z-interconnection of the die is made by electrically conductive polymer elements into which the projecting parts of the interconnection terminals extend.

It can be advantageous to carry out certain processing steps at the wafer level, prior to singulation of the die. At some stage in die preparation, the wafer is cut to singulate the die. That is, the wafer is cut (for example, by sawing the wafer along "streets" between active circuit regions of the die), forming an array of die (a "wafer array") on the wafer support. The singulated die can then be manipulated individually (for example by use of a "pick-and-place" tool) for further treatment.

U.S. application Ser. No. 12/124,077, referenced above, describes various die stack configurations, including, among others, offset die stacks, and staggered die stacks, and including stacks in which the various die in the stack have various dimensions.

U.S. application Ser. No. 12/142,589, referenced above, describes methods for passivation (forming electrical insulation) onto die surfaces at the wafer or wafer array level.

U.S. application Ser. No. 12/323,288, referenced above, describes methods for separating die from a wafer by cutting the wafer in two stages. The first wafer cutting procedure includes cutting along a first set of saw streets to a depth greater than the prescribed die thickness and optionally along a second set of saw streets to a depth less than the die thickness. The result of the first cutting procedure is an array of strips or blocks of die, each including a plurality of connected die, that are less subject to shift than are individual singulated die. In a second wafer cutting procedure the die are singulated by cutting through along a second set of streets. Subsequent to the first cutting procedure, and prior to the second cutting procedure, additional die preparation procedures that are sensitive to die shift may be carried out. In some such methods the first wafer cutting procedure is carried out prior to thinning the wafer to the prescribed die thickness; and in other such methods the wafer is thinned to the prescribed die thickness prior to carrying out the first wafer cutting procedure. In some examples of the method the first cut is made along saw streets fronting interconnect edges.

The patents and patent applications referenced herein above and below are incorporated by reference herein.

SUMMARY

In a general aspect the invention features methods for forming connectors on die pads at a wafer level of processing, by forming spots of a curable electrically conductive material over die pads and extending over the interconnect die edge; curing the conductive material; and in a wafer cutting procedure thereafter severing the spots.

In some embodiments the die is covered with a conformal electrically insulative coating, and openings are made in the conformal coating to expose surfaces of selected die pads to provide for electrical connection of the spots and the selected die pads, prior to forming the spots of electrically conductive material over the pads; the conformal coating prevents electrical contact between the spots and features on the die where electrical continuity is to be avoided. In some embodiments a second conformal electrically insulative coating is formed following cure of the spots, and in some such embodiments openings are formed in the coating exposing surfaces of selected cured spots to provide for electrical connection to z-interconnects.

In some embodiments the wafer is thinned prior to a first wafer cutting procedure along first saw streets. In some embodiments the spots are formed and cured prior to the first wafer cutting procedure, and the first wafer cutting procedure severs the cured spots and forms interconnect sidewalls on the die. In other embodiments the spots are formed subsequent to the first wafer cutting procedure, and the spots are formed over (and may span but usually do not span) the channel formed by the first wafer cutting procedure and then cured; in such embodiments the cured spots are severed in a subsequent wafer cutting procedure (using a narrower saw) along the interconnect streets. In such embodiments the cured electrically conductive spots may overhang the interconnect die edge to some extent.

In some embodiments in which the wafer is thinned prior to a first wafer cutting procedure, there may be a single conformal dielectric coating procedure; in other embodiments in which the wafer is thinned prior to a first wafer cutting procedure, there may be two conformal dielectric coating procedures.

A sequence of procedures in some such (thin-prior-to first cut) embodiments (single coating procedure) includes stages of:
  a) thinning the wafer (for example, by backgrinding);
  b) applying a die attach film (DAF) to the backside of the thinned wafer;
  c) cutting (for example, sawing) along interconnect streets from the front side through the wafer and into but not through the DAF;
  d) depositing conformal coating over surfaces exposed at the front side of the wafer (front sides of die active areas, and interconnect die edges and sidewalls);
  e) forming openings (for example by laser ablation) to expose features (such as selected die pads) at which electrical contact is desired;
  f) forming and curing spots of curable electrically conductive material over die pads and overhanging the interconnect die edges;
  g) cutting (for example, sawing, using a narrower saw than for the first cutting, so that the saw does not disrupt the coating on the sidewalls) again along the interconnect streets, severing the overhanging cured conductive spots and cutting through the DAF; and
  h) cutting through the wafer and the DAF along noninterconnect streets to singulate the die.

A sequence of procedures in other such (thin-prior-to first cut) embodiments (two coating procedures) includes stages of:
  a) depositing conformal coating over the front side of the unthinned and uncut wafer;
  b) forming openings (for example by laser ablation) to expose features (such as selected die pads) at which electrical contact is desired;
  c) forming and curing spots of curable electrically conductive material over die pads and overhanging interconnect die edges;
  d) thinning the wafer (for example by backgrinding);
  e) applying a die attach film (DAF) to the backside of the thinned wafer;
  f) cutting (for example, sawing) along interconnect streets from the front side through the cured spots and through the wafer and into the DAF;
  g) depositing a second conformal coating over the front side of the wafer and features thereon (e.g. surfaces of cured spots of curable electrically conductive material, and surfaces exposed by the first cutting);
  h) cutting (for example, sawing, using a narrower saw than for the first cutting, so that the saw does not disrupt the coating on the sidewalls) again along the interconnect streets, cutting through the DAF; and
  i) cutting through the wafer and the DAF along noninterconnect streets to singulate the die.

In some embodiments the wafer is thinned subsequent to a first wafer cutting procedure. In some embodiments the first wafer cutting procedure is made to a depth greater than the eventual die thickness and less than the full wafer thickness, forming interconnect sidewalls.

In some embodiments a heating procedure is applied, sufficient to render the DAF temporarily tacky, at a time after depositing the second coating of parylene.

In another general aspect the invention features an assembly of die in a staggered stack configuration, in which an interconnect sidewall of an upper die in the stack is horizontally offset in relation to an interconnect sidewall of an underlying die.

In some embodiments the die in the stack are prepared generally as described above.

BRIEF DESCRIPTION OF THE DRAWINGS

FIG. 20A is a diagrammatic sketch in a sectional view showing a stack of die mounted on a substrate, according to another embodiment of the invention.

FIG. 20B is a diagrammatic sketch in partial sectional views showing details of an interconnected die stack as in FIG. 20A, as indicated at $B_L$ and $B_R$.

DETAILED DESCRIPTION

The invention will now be described in further detail by reference to the drawings, which illustrate alternative embodiments of the invention. The drawings are diagrammatic, showing features of the invention and their relation to other features and structures, and are not made to scale. For improved clarity of presentation, in the FIGs. illustrating embodiments of the invention, elements corresponding to elements shown in other drawings are not all particularly renumbered, although they are all readily identifiable in all the FIGs. Also for clarity of presentation certain features are not shown in the FIGs., where not necessary for an understanding of the invention.

Figure 1A:
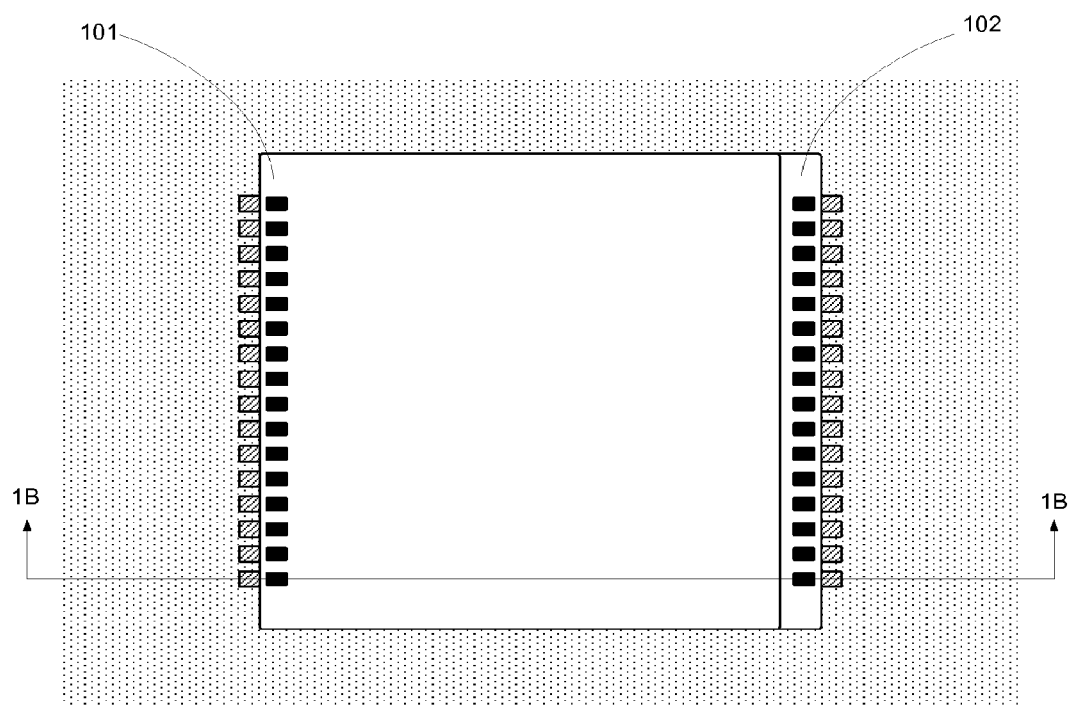
FIG. 1A is a diagrammatic sketch in a plan view showing a stack of die mounted on a substrate, according to another embodiment of the invention.

FIG. 1A shows an example a stacked die assembly, in which adjacent offset die in the stack are mounted one over another so that respective interconnect edges are vertically aligned, as described for example is U.S. patent application Ser. No. 12/124,077, referenced above. Such an arrangement may be referred to as a "staggered" stack configuration. For convenience in this description, vertically adjacent die are referred to as a "pair" of die, although they need not be functionally related as a pair nor handled as a pair during processing. The die in each pair, for example the top pair of die 101, 102, are oppositely oriented, so that the interconnect edges 103 and 104 are at opposite sides of the stack. The arrangement is shown in further detail in FIG. 1C.

Figure 1B:
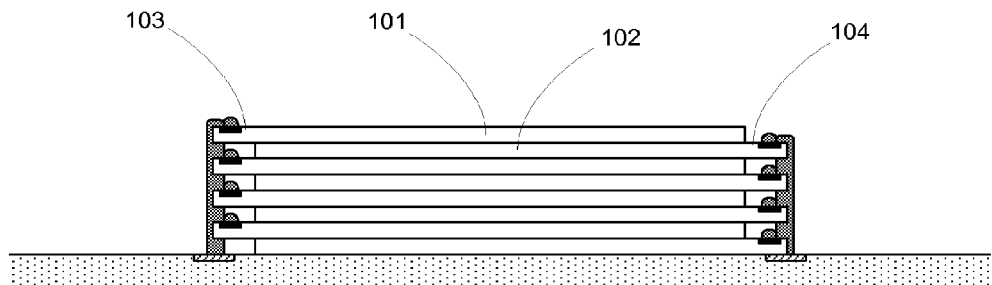
FIGS. 1B and 1C are diagrammatic sketches showing an embodiment of an interconnected stacked die assembly in a sectional view as indicated at 1B-1B in FIG. 1A.
Figure 1C:
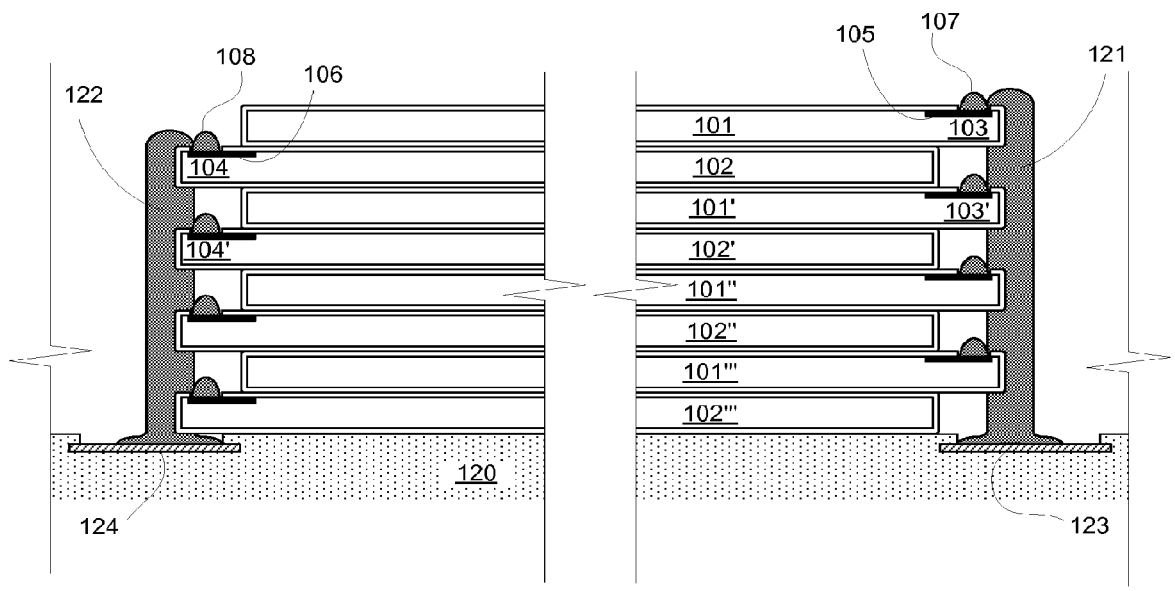

FIG. 1B shows in a sectional view an example of a stacked die assembly generally as in FIG. 1A, interconnected by columns of interconnect material. FIG. 1C shows the interconnection of the die in greater detail, in partial sectional views.

Referring now to FIG. 1C, die 101 is stacked over die 102 constituting a first (top) die pair. The interconnect margin 103 of die 101 is oriented toward the right in the FIG., and the interconnect margin 104 of die 102 is oriented toward the left. The die are offset so that the interconnect terminals of interconnect margin 104 is exposed. The interconnect terminals 105, 106 are each provided with a glob or knob of conductive material 107, 108, to provide contact access for columns 121, 122 of interconnect material formed at the sides.

As FIG. 1C shows, each interconnect margin 103, 104 of the first pair of die 101, 102 overhangs the interconnect margin of the pair of die beneath; thus, interconnect margins 103, 104 of the first pair of die 101, 102 overhang interconnect margins 103', 104' of the next pair of die 101', 102'. In this construct the (even numbered) die 102, 102' serve as spacers for the (odd numbered) die 101, 101'. Referring again to FIG. 1C, the stack of die are mounted on a support (here, substrate 120) so that the die edges overlap corresponding interconnect sites 123, 124 in the substrate. After the die stack is mounted on the substrate, interconnect traces 121, 122 (z-interconnects) are formed, contacting the knobs (e.g., 107, 108) at the die and contacting the sites 123, 124 in the substrate. Accordingly, the interconnect trace 122 provides electrical continuity between site 124 and circuitry on die 102, 102', 102'', 102''' and the interconnect trace 121 provides electrical continuity between site 123 and circuitry on die 101, 101', 101'', 101'''.

Interconnect materials suitable for the traces 121, 122 include, for example, curable conductive polymers such as curable polymers filled with particulate conductive material, or conductive epoxies, or conductive inks. Because the interconnect traces in these embodiments are not externally supported between the interconnect sites on the substrate and the die, or between the spaced-apart die, the interconnect material must be sufficiently firm in the uncured state to maintain the columnar shape and the contact with the knobs or globs. Suitable polymers have a high thixotropic index, usually 6.5 or greater; and a high viscosity, usually 30,000 cps or greater. (The thixotropic index and viscosity must not be so high as to make the material unworkable or so that incursion of the material over the die edge to make contact with the knobs is not possible.) Formation of the columns may be made by, for example, a pulse dispense procedure, as described in U.S. application Ser. No. 12/124,097, cited above; or by, for example, an aerosol spray procedure, as described in U.S. application Ser. No. 12/634,598, cited above.

Electrical connection of the globs or knobs to the z-interconnects depends upon robust electrical contact, and contact may be compromised because the knob is situated inboard from the die edge and contact requires ingress of the material of the z-interconnect traces between the die. This may require a compromise in the rheological properties of the z-interconnect trace material: for instance the viscosity of the material in the uncured state must be low enough to allow ingress, yet high enough so that the interconnect trace material in the uncured state maintains form.

Figure 2:
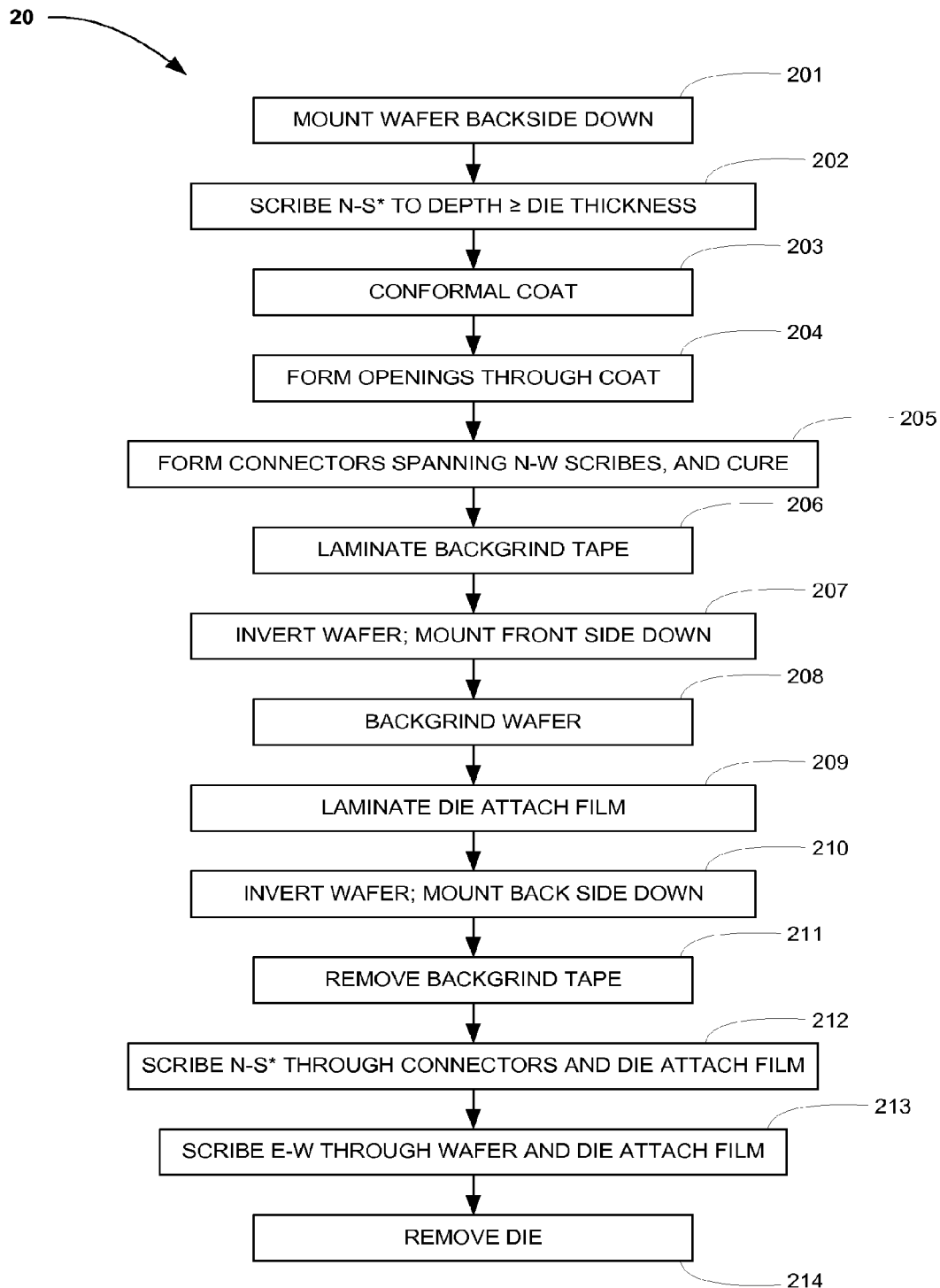
FIG. 2 is a flow diagram showing stages in a process according to an embodiment of the invention for preparing die for stacking and z-interconnection.

FIG. 2 illustrates stages in a process for preparing die for stacking and z-interconnection according to an embodiment of the invention; and FIGS. 3A and 3B illustrate stages in a process for forming a package containing a stack of such die in a staggered configuration.

Referring to FIG. 2, various stages are shown, some of which are conventional process steps. In this embodiment the wafer is thinned in a backgrind procedure 208 subsequent to a first cutting procedure 202. Also in this embodiment the first cutting procedure 202 is carried out prior to the procedure 205 of forming the spots of curable electrically conductive material; and the cured spots (connectors) are severed in a subsequent cutting procedure 212 along the same saw streets.

Particularly suitable materials for the spots include materials that can be applied in a flowable state and thereafter cured to form the electrical connectors and, depending upon the material and the technique, the interconnect material may be deposited in an uncured or partially cured state, and the material may be partially or additionally cured at an intermediate stage following dispense, and may be fully cured when dispense has been completed. Where the interconnect material is a curable material, it may be electrically conductive as deposited, or as partially or fully cured. A suitable interconnect material may be an electrically conductive polymer. Suitable electrically conductive polymers include polymers filled with conductive material in particle form such as, for example, metal-filled polymers, including, for example metal filled epoxy, metal filled thermosetting polymers, metal filled thermoplastic polymers, or an electrically conductive ink. The conductive particles may range widely in size and shape; they may be for example nanoparticles or larger particles. In some embodiments the conductive material can be a partially-curable polymer; a partial cure may be performed at an earlier stage in the process, and a final cure or post-cure may be performed at a later stage to increase the robustness of the interconnection. Where the spots extend over the die edge (that is, where they are formed over (and may span) the channel, suitable materials are selected as having rheological properties (viscosity, thixotropy) suited for maintaining their form in an uncured state for a time sufficient to at least partially cure the material.

Figure 12A:
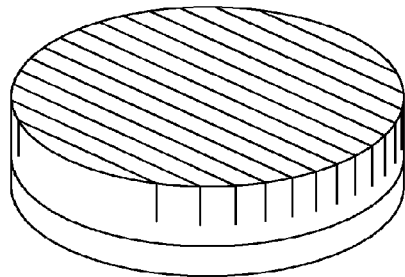
FIGS. 12A, 12B, 13, 14, 15, 16A, 16B, 17A, 17B, 18A, 18B are diagrammatic sketches in perspective views (12A, 16A, 17A, 18A) and in partial sectional views showing results of certain of the procedures described with reference to FIG. 2.
Figure 12B:
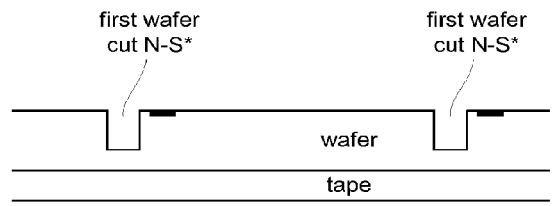

The first wafer cutting procedure 202 is carried out along interconnect saw streets; in the example, the interconnect saw streets are parallel in a first direction, and they are here referred to for easy reference as the N-S* streets. This cutting procedure forms channels along the N-S* streets to a depth at least as great as an ultimate die thickness, and less than the full wafer thickness; that is, this first cutting procedure forms interconnect die sidewalls but leaves some wafer material at the bottom of the N-S* channels. A result is shown in FIGS. 12A, 12B.

Figure 13:
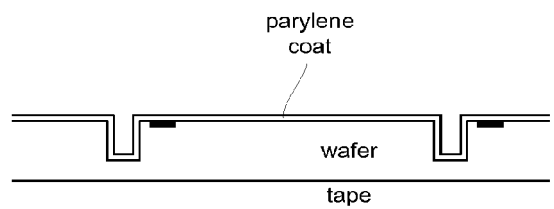

In the conformal coat procedure 203 the conformal coating is formed by deposition, for example by vapor deposition, or liquid phase deposition, or by solid phase deposition. A result is shown in FIG. 13. The material of the conformal coating may include a vapor phase, liquid phase, or B-staged dielectric material, adhesive, or coating of defined thickness. In some embodiments the material of the conformal coating includes an organic polymer, for example a polymer of p-xylene or a derivative thereof, such as a polyxylylene polymer, e.g., a parylene C or a parylene N, or a parylene A. A parylene may be particularly suitable, and the parylene coating may be formed in a conventional parylene apparatus.

Figure 14:
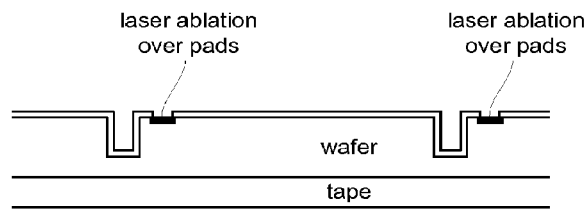

Openings may be formed 204 through selected sites in the coating by, for example, laser ablation. A result is shown in FIG. 14.

Figure 15:
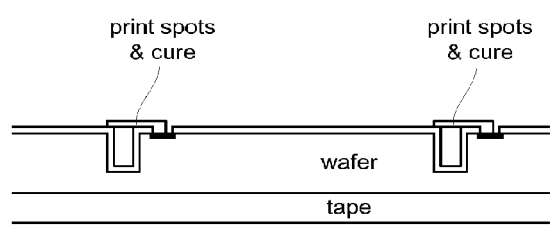

As noted above, preferred materials for the connectors include curable materials, which can be deposited as spots in flowable form in an uncured state and thereafter cured to form the connectors. The spots of curable material may be formed 205 for the connectors by any of a variety of deposition techniques, including dispensing and printing, for example. The particular deposition technique may depend upon the material employed. The material may be cured (or allowed to cure) by a technique appropriate for the particular material employed; some curable filled conductive epoxies, for example, are cured by application of heat. A result is shown in FIG. 15. In the example shown, the spots bridge the channels formed by the first wafer cutting procedure; in other examples the spots are formed so that they contact the die pads and extend up to or beyond the interconnect die edge, but do not bridge the channel.

Figure 16A:
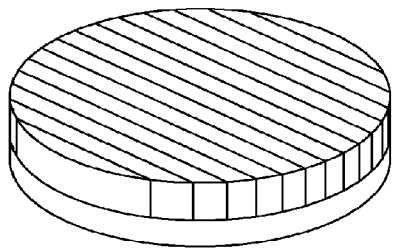
Figure 16B:
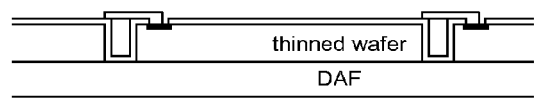

Because the first cutting procedure along the N-S* streets 202 formed a channel to a depth greater than an ultimate die thickness, the backgrind procedure 208 thins the wafer to the ultimate die thickness and, accordingly, it results in opening the N-S* streets and yielding an array of strips of die. A die attach film is applied to the backside of the array of strips of die in the laminate procedure 209, with a result as shown in FIGS. 16A, 16B. (A backgrind tape may be employed to secure the wafer during backgrind, and may additionally be present on the front side of the wafer at this stage, not shown in the FIGs.)

The die attach film, together with a dicing tape (and the backgrind tape, until it has been removed) serve to support the array of die strips during the wafer inversion and mounting 210 and removal of the backgrind tape, and maintains the alignment of the die strips during the N-S* cutting procedure 212.

Figure 17A:
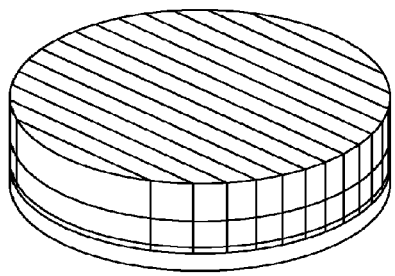
Figure 17B:
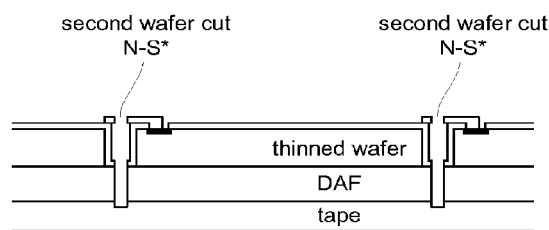

A second wafer cutting procedure 212 on N-S* streets employs a narrower saw than was used for the first N-S* wafer cutting procedure 202, so that the movement of the saw does not impinge upon the conformal coat on the die sidewalls. This procedure cuts at least part way through the DAF film along these streets, and—where, as here, the connectors bridge the channel—severs the connectors. A result is shown in FIGS. 17A, 17B. Where the connectors do not bridge the channel, but extend over the saw street, the saw may cut off the connectors; on the other hand, where the connectors do not extend over the saw street, the saw will not touch the connectors.

Figure 18A:
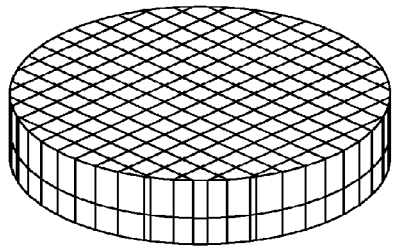

A wafer cutting procedure 213 along the noninterconnect streets (here termed the "E-W streets") cuts through entirely through the (earlier thinned) wafer and serves to singulate the die in a die array on the tape. A result is shown in FIG. 18A.

Figure 18B:
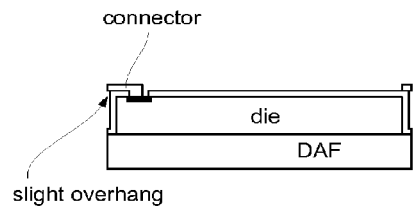

Thereafter the tape may be expanded and the singulated die may be removed 214. A resulting singulated die is shown in FIG. 18B.

Figure 3:
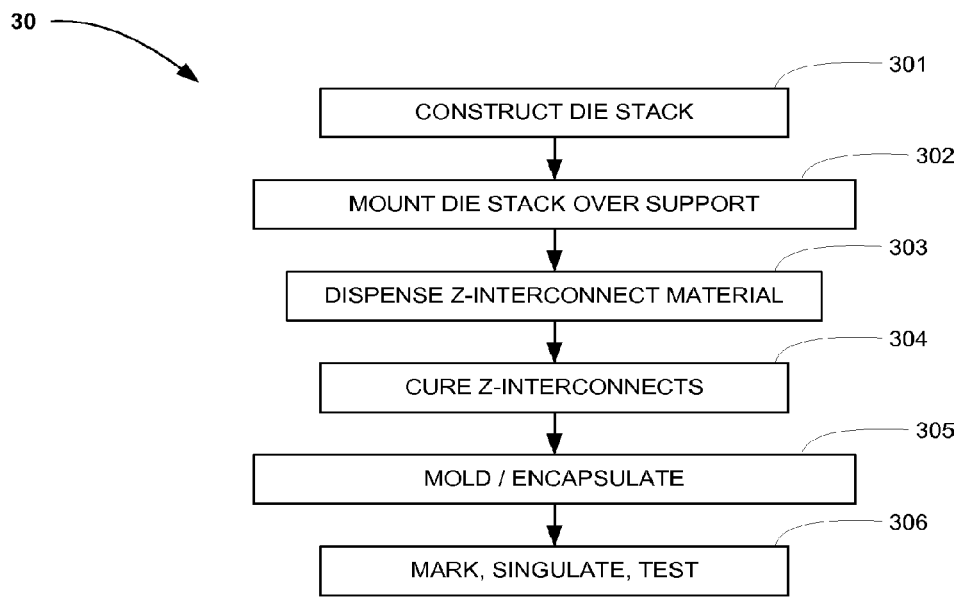
FIGS. 3 and 4 are flow diagrams showing stages in a process according to an embodiment of the invention for making a package of stacked die in a staggered stack configuration.
Figure 4:
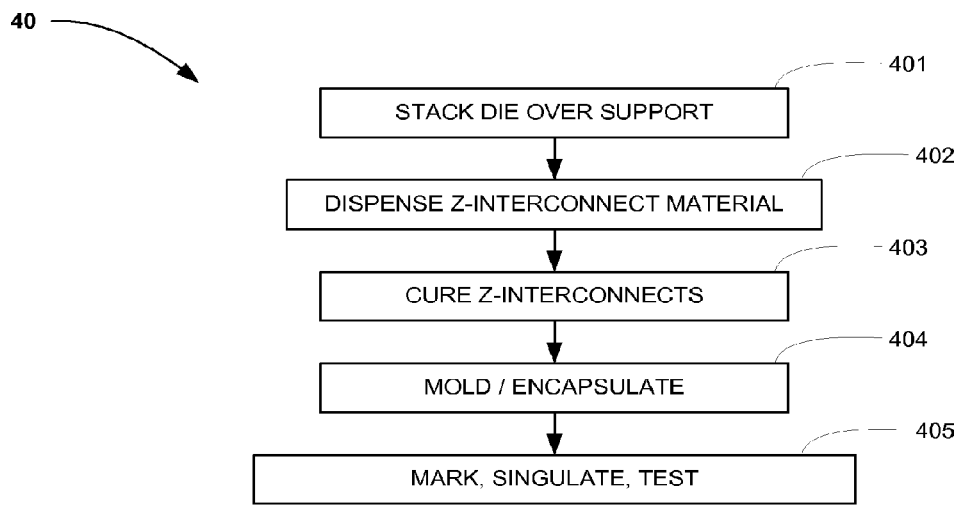

FIGS. 3 and 4 illustrate two examples of processes for making a package of stacked die in a staggered stack configuration. In the example of FIG. 3 the die stack is constructed separately from the support, and then the stack is mounted over and the die are electrically connected to the support (z-interconnect). In the example of FIG. 4 the die are serially stacked in situ on the support, and then the die are electrically connected to the support (z-interconnect).

Referring to FIG. 3, die prepared as described for example with reference to FIG. 2 are stacked using a pick-and-place tool in the desired stack configuration. Each die in this example is affixed to the underlying die by the DAF. Once the stack is complete 301, it is mounted 302 over a die mount surface of a support. The support is provided with bond sites at the die mount surface, and the die in the stack are oriented so that the connectors at the interconnect edges overlie and are generally aligned with corresponding bond sites on the support. The stack may adhere to the substrate by a DAF on the lowermost die, or by a separate adhesive. Following this stage 302 the assembly is ready for z-interconnection, as outlined below.

Referring to FIG. 4, die prepared as described for example with reference to FIG. 2 are stacked serially 401 over the support using a pick-and-place tool in the desired stack configuration. The support is provided with bond sites at the die mount surface, and the die in the stack (beginning with the first) are oriented so that the connectors at the interconnect edges overlie and are generally aligned with corresponding bond sites on the support. The first (lowermost) die in the stack may adhere to the substrate by the DAF on the backside, or by a separate adhesive, and each subsequently mounted die adheres to the underlying die by the DAF on the backside. Once the stack is complete 401 the assembly is ready for z-interconnection, as outlined below.

Once the die stacks are ready for electrical connection (die-to-die and stacked die-to-substrate: z-interconnection) a curable electrically conductive material is dispensed 303; 402) to form interconnect traces contacting the connectors and contacting corresponding bond sites on the support.

Electrically conductive materials suitable for the z-interconnection include materials that can be applied in a flowable state and thereafter cured to form the electrical connectors and, depending upon the material and the technique, the z-interconnect material may be deposited in an uncured or partially cured state, and the material may be partially or additionally cured at an intermediate stage following dispense, and may be fully cured when dispense has been completed. Where the z-interconnect material is a curable material, it may be electrically conductive as deposited, or as partially or fully cured. A suitable z-interconnect material may be an electrically conductive polymer. Suitable electrically conductive polymers include polymers filled with conductive material in particle form such as, for example, metal-filled polymers, including, for example metal filled epoxy, metal filled thermosetting polymers, metal filled thermoplastic polymers, or an electrically conductive ink. The conductive particles may range widely in size and shape; they may be for example nanoparticles or larger particles. In some embodiments the conductive material can be a partially-curable polymer; a partial cure may be performed at an earlier stage in the process, and a final cure or post-cure may be performed at a later stage to increase the robustness of the interconnection.

Depending upon how much support the die stack provides to the material as dispensed, suitable materials are selected as having rheological properties (viscosity, thixotropy) suited for maintaining their form in an uncured state for a time sufficient to at least partially cure the material. For example, where the z-interconnect spans a vertical gap between the support and the die, or between a die and a spaced-apart overlying die (as in a staggered stack configuration, for example), the interconnect material must be sufficiently firm in the uncured state to maintain its shape and the contact with the connectors (cured spots) on the die. Suitable polymers may have a high thixotropic index, usually 6.5 or greater; and a high viscosity, usually 30,000 cps or greater. (The thixotropic index and viscosity must not be so high as to make the material unworkable or so that incursion of the material over the die edge to make contact with the connectors on the die is not possible.) Formation of the z-interconnects may be made, for example, by a pulse dispense procedure, as described in U.S. application Ser. No. 12/124,097, cited above; or, for example, by an aerosol spray procedure, as described in U.S. application Ser. No. 12/634,598, cited above.

Following dispense 303, 402 of the z-interconnect material traces, the traces are cured 304, 403 to complete the z-interconnects. The material may be cured (or allowed to cure) by a technique appropriate for the particular material employed; some curable filled conductive epoxies, for example, are cured by application of heat.

Following cure of the z-interconnects, the assembly is molded or encapsulated 305, 404 to protect the die stack, z-interconnects, and upper surface of the support from environmental conditions (mechanical, chemical) when the package is deployed for use in a device. Packages may be marked for identification. Typically an array of stacked die are formed on a support (substrate) strip, and where this is so the packages are singulated by cutting through the support strip. The packages are tested 306, 405 and packages that fail test criteria are discarded.

Figure 5:
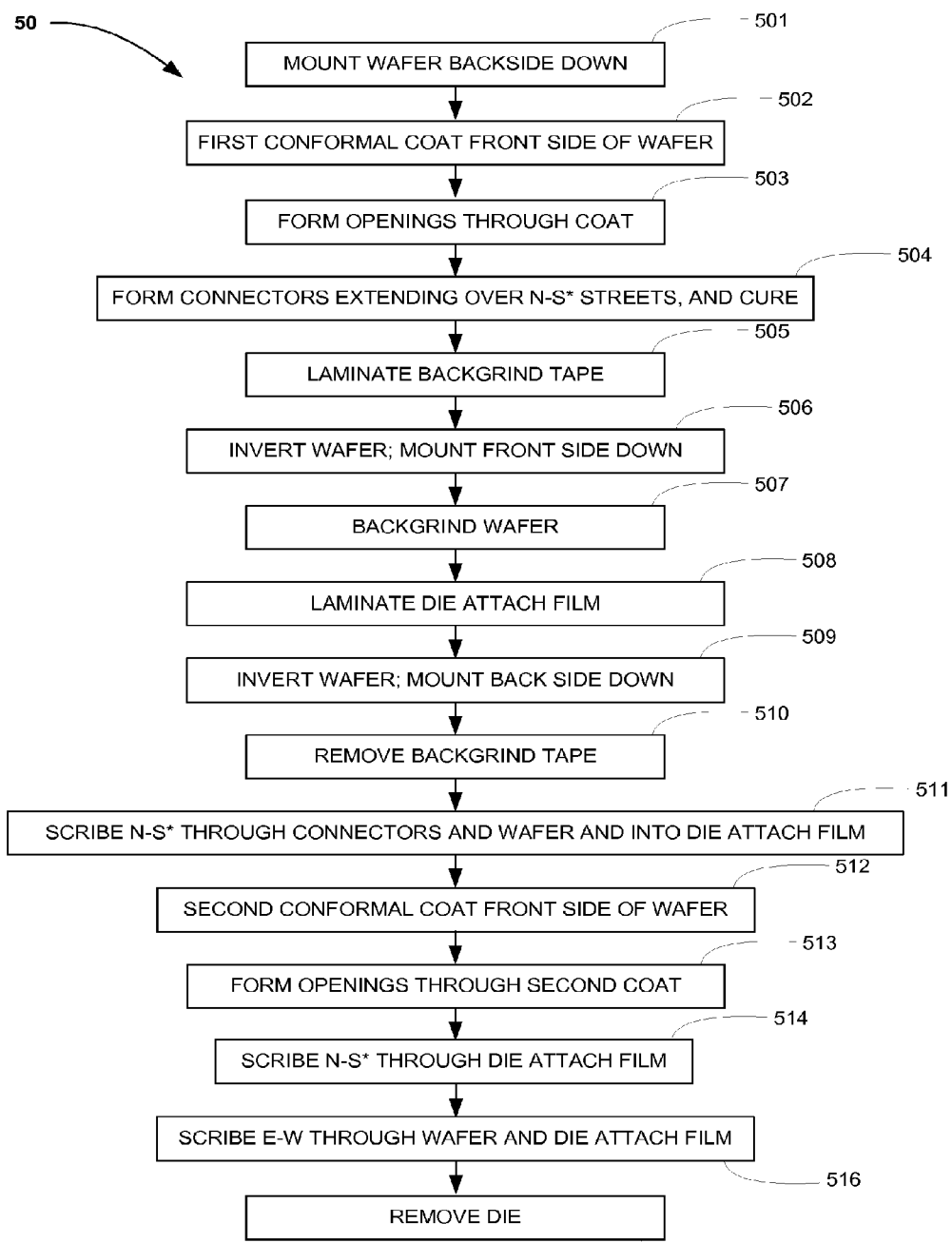
FIG. 5 is a flow diagram showing stages in a process according to another embodiment of the invention for preparing die for stacking and z-interconnection.

FIG. 5 illustrates stages in a process for preparing die for stacking and z-interconnection according to another embodiment of the invention. Here the wafer is thinned prior to the first wafer cut, and two conformal dielectric coating procedures are carried out.

Referring to FIG. 5, various stages are shown, some of which are conventional process steps. In this embodiment the wafer is thinned in a backgrind procedure 507 prior to a first cutting procedure 511. Also in this embodiment the procedure of forming the spots of curable electrically conductive material 504 is carried out subsequent to a first conformal coating procedure and prior to the first cutting procedure 511, and the cured spots (connectors) are severed in the first cutting procedure 511.

Particularly suitable materials for the spots include materials that can be applied in a flowable state and thereafter cured to form the electrical connectors and, depending upon the material and the technique, the interconnect material may be deposited in an uncured or partially cured state, and the material may be partially or additionally cured at an intermediate stage following dispense, and may be fully cured when dispense has been completed. Once fully cured, the material is not meant to be reflowed and may not be capable of being reflowed. Where the interconnect material is a curable material, it may be electrically conductive as deposited, or as partially or fully cured. A suitable interconnect material may be an electrically conductive polymer. Suitable electrically conductive polymers include polymers filled with conductive material in particle form such as, for example, metal-filled polymers, including, for example metal filled epoxy, metal filled thermosetting polymers, metal filled thermoplastic polymers, or an electrically conductive ink. The conductive particles may range widely in size and shape; they may be for example nanoparticles or larger particles. In some embodiments the conductive material can be a partially-curable polymer; a partial cure may be performed at an earlier stage in the process, and a final cure or post-cure may be performed at a later stage to increase the robustness of the interconnection. Where the spots extend over the die edge (that is, where they are formed over (and may span) the channel, suitable materials are selected as having rheological properties (viscosity, thixotropy) suited for maintaining their form in an uncured state for a time sufficient to at least partially cure the material. A conductive ink, applicable using an aerospray process, may be particularly useful; and multi-component conductive inks may in some applications be preferred. Such multi-component conductive inks may include a carrier (which may be or may include a curable polymer) containing two or more different metal components in particulate form (which may be capable of forming conductive intermetallics under cure conditions), together with additives that serve among other uses to remove metal oxides from the particle surfaces.

The first wafer cutting procedure 511 is carried out along interconnect saw streets; in the example, the interconnect saw streets are parallel in a first direction, and they are here referred to for easy reference as the N-S* streets. This cutting procedure goes entirely through the thinned wafer and into the DAF; that is, this first cutting procedure forms interconnect die sidewalls and leaves no wafer material at the bottom of the cuts.

The conformal coat procedure 502 covers the front side of the wafer and all features on it. The conformal coating is formed by deposition, for example by vapor deposition, or liquid phase deposition, or by solid phase deposition. The material of the conformal coating may include a vapor phase, liquid phase, or B-staged dielectric material, adhesive, or coating of defined thickness. In some embodiments the material of the conformal coating includes an organic polymer, for example a polymer of p-xylene or a derivative thereof, such as a polyxylylene polymer, e.g., a parylene C or a parylene N, or a parylene A. A parylene may be particularly suitable, and the parylene coating may be formed in a conventional parylene apparatus.

Openings may be formed 503 through selected sites in the coating by, for example, laser ablation.

The connectors are formed 504 by deposition of a curable material in spots over the die pads and extending over the die edge onto (and optionally over) the interconnect streets, followed by cure of the connector material. As noted above, preferred materials for the connectors include curable materials, which can be deposited as spots in flowable form in an uncured state and thereafter cured to form the connectors. The spots of curable material may be formed 504 for the connectors by any of a variety of deposition techniques, including dispensing and printing, for example. The particular deposition technique may depend upon the material employed. The material may be cured (or allowed to cure) by a technique appropriate for the particular material employed; some curable filled conductive epoxies, for example, are cured by application of heat.

The first cutting procedure 511 along the N-S* streets severs the connectors and passes through the wafer and into the DAF. Accordingly, the connectors are cut off roughly flush with the interconnect die edge and the interconnect die sidewall.

The die attach film applied earlier in the laminate procedure 505, together with a dicing tape (and the backgrind tape, until it has been removed) serve to support the thinned wafer and the array of die strips during the wafer inversion and mounting 509 and removal of the backgrind tape 510, and maintain the alignment of the die strips following the first N-S* cutting procedure 511.

The second conformal coating procedure 512 covers all the available surfaces (except the backside of the die strips), including: the connectors, including—where present—the surfaces where they were cut off by the first cutting procedure 511; the interconnect die sidewalls, the DAF at the bottom of the first cuts; surfaces exposed by earlier forming openings through the coat 503 (except where covered by the connectors); and the surfaces earlier coated 502 and not subsequently removed by forming openings or obscured by additional features (particularly, the conductive spots).

Openings may be formed 513 at selected sites through the second conformal dielectric coating (and through any underlying first conformal dielectric coating not earlier removed). These openings in the second coating expose features (such as portions of the surface of the connectors) at which electrical connection to the z-interconnects is to be made.

A second wafer cutting procedure 514 on N-S* streets employs a narrower saw than was used for the first N-S* wafer cutting procedure 511, so that the movement of the saw does not impinge upon the conformal coat on the die sidewalls. This procedure cuts through the DAF film along these streets.

Optionally, it may be advantageous to employ a heat treatment at some stage (for example, following the opening procedure 513) to render the DAF temporarily tacky, to improve adhesion to the DAF by the second parylene coating.

And, optionally, it may be advantageous to direct laser energy with a wide image size along the channels, to form openings in the parylene at the top and side surfaces of the connectors, rather than only at the top. The first parylene coating is in some embodiments thicker than the second parylene coating (the first may, for example, be 5 um thick and the second may, for example, be 2.5 um thick). The lasing procedure is carried out to cut entirely through the second parylene coating (exposing the contact areas as desired on the connectors, for example); but not to cut through the thicker first parylene coating. The image size is set to allow removal of parylene over a suitably wide swath parallel to the interconnect die edge, the swath width may be great enough to go beyond the die edge and into the channel, but it typically is not wide enough to pass more than halfway across the channel. As will e appreciated, where a selected pad is not meant to be electrically connected, delivery of the laser energy can be interrupted to make a break in the swath.

Where the connector is a spot or blob of a cured electrically conductive material including particles in a polymer matrix, the lasing procedure may remove some of the cure polymer at the connector surface, exposing the particles. This can provide more direct contact and increased surface for electrical contact of the Z-interconnect material with the connector.

A wafer cutting procedure 516 along the noninterconnect streets (here termed the "E-W streets") cuts through entirely through the (earlier thinned) wafer and serves to singulate the die in a die array on the tape.

Thereafter the tape may be expanded and the singulated die may be removed 518. The prepared die may be stacked, z-interconnected, and molded/encapsulated; and the resulting packages may be singulated and tested generally as described with reference to either of FIGS. 3 and 4.

Figure 6:
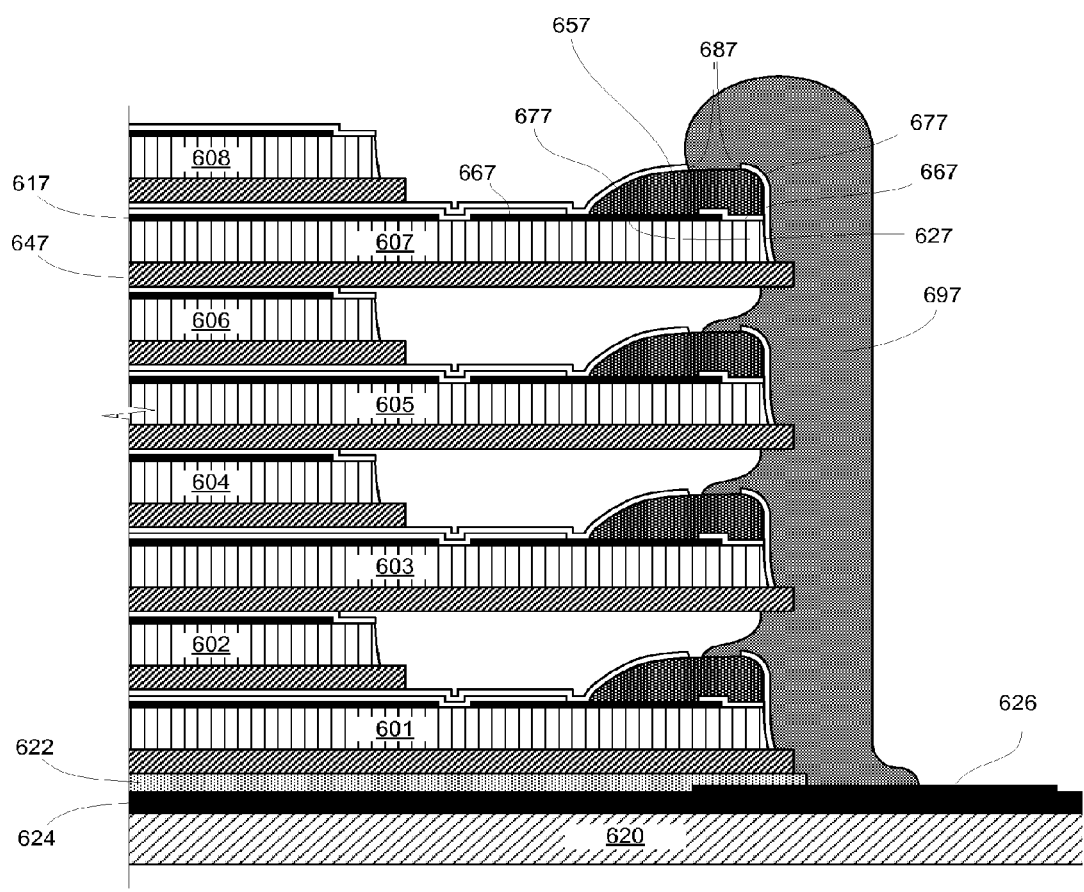
FIG. 6 is a diagrammatic sketch in a partial sectional view showing part of a stacked die assembly according to an embodiment of the invention.

A detail of a stacked die assembly in a staggered stack configuration, made generally as described with reference to FIGS. 5 (and FIG. 3 or 4) is shown in a sectional view in FIG. 6. In the example shown, the conformal dielectric coatings are parylene films (parylene 1 and parylene 2), and the openings in the second parylene film (parylene 2) were formed by selective laser ablation to expose areas of the surface of the connectors for electrical connection with intruding z-interconnect material. Referring particularly to FIG. 6, odd-numbered die (601, 603, 605, 607) are shown spaced-apart by even-numbered die (602, 604, 606, 608). The interconnect ends of the odd-numbered die are shown; the interconnect ends of the even-numbered die do not appear in this partial sectional view. Each die has a front ("active") side, in which the die circuitry is formed. At the front surface of each die routing connections (e.g., 617) to the die pads (e.g., 627) are situated. The back side of each die is provided with a die attach film (DAF), for example 647. A connector (e.g., 657) is formed in contact with each die pad (e.g., 627); in the example shown the connectors are blobs of electrically conductive material. As described above, two layers of parylene are formed over the die, parylene 1 (667) and parylene 2 (677). Parylene 1 covers and insulates the active side of the die and routing connections thereon, and an opening in parylene 1 exposes a portion of the die pad. Parylene 2 is formed over parylene 1 at the active side of the die, and covers and insulates the interconnect sidewall of the die and the connectors. An opening (e.g., 687) in parylene 2 exposes a portion of the connector for electrical contact with the Z-interconnect 697. The die stack is affixed using an adhesive 622 to a substrate 620. The adhesive 622 may constitute a DAF, typically thicker (for example, about 20 um thick) than the DAF employed at the backside of each die (for example, about 10 um thick). Electrical circuitry (e.g., 624) in the substrate connects to bond pads 626 at the mounting surface of the substrate. Die in the stack are electrically connected to the substrate by way of the Z-interconnect 697, which contacts the bond pad 626 and the exposed area of connector 657. As will be appreciated, openings in parylene 2 may be made over selected connectors, with the result that non-selected connectors will not contact the Z-interconnect, and electrical connection of the die pad underlying the non-selected connector will be avoided.

The connectors may have any of a variety of shapes, as noted above with reference to FIGS. 7-11. For example, the face of the connector 657 may be more planar than shown in FIG. 6, and may form a more abrupt (nearly right-angle) intersection with the top, as suggested in FIG. 9.

As described above, the die pad to z-interconnect connector may be formed by depositing a curable conductive material to form a spot over the die pad, extending over the die edge; curing the spot; and then severing the cured spot either at or outboard from the die edge. The dimensions of the spot will depend in part upon the dimensions of the contact surface of the pad. A spot may typically, by way of example, have a width (in a direction parallel to the die edge) about 50 um; and may have a thickness (as measured perpendicular to the pad surface) in a range about 20 um to about 30 um.

Surfaces of the connectors in die prepared as described with reference to FIG. 5 may be exposed for electrical connection with the z-interconnect in any of a variety of ways other than laser ablation. For example, a dicing saw may be deployed to cut into the connectors near the die edge to form notches of various configurations. FIGS. 7-11 are idealized sketches in sectional views illustrating a few such configurations. The dimensions in these drawings are typical examples, and other shapes and dimensions may be useful.

Figure 7:
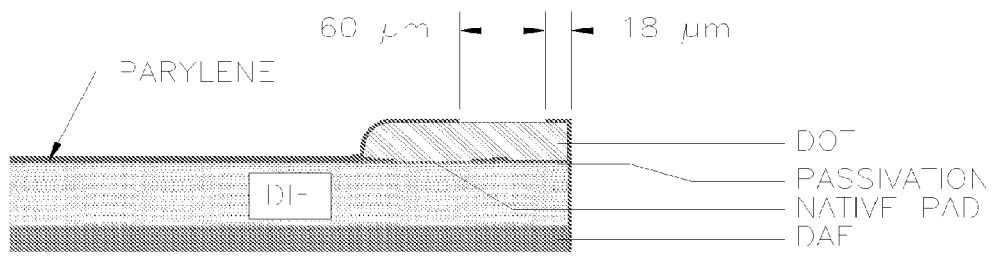
FIGS. 7, 8, 9, 10, 11 are idealized diagrammatic sketches in partial sectional views showing connector configurations according to various embodiments of the invention.
Figure 8:
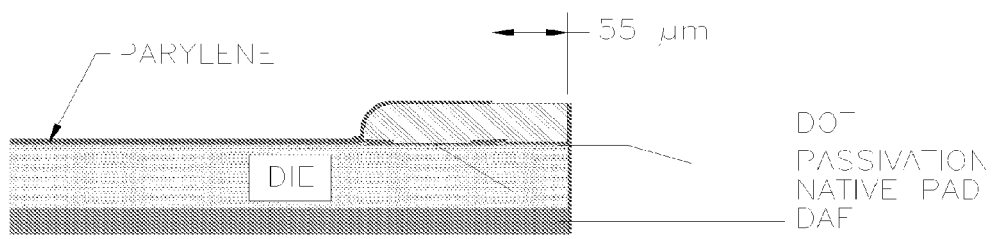

FIG. 7 is an idealized sketch showing a die in which an opening over the connector ("dot" in the drawing) was formed by laser ablation of the second parylene coating to expose an area (dimension 60 um in the FIG.) of the connector slightly inboard (18 um in the FIG) from the die edge. FIG. 8 is an idealized sketch showing a die in which an opening over the connector ("dot" in the drawing) was formed by laser ablation of the second parylene coating to expose an area (dimension 55 um in the FIG.) of the connector at the die edge. As compared with the configuration of FIG. 7, a configuration as in FIG. 8 reduces the extent to which the z-interconnect material must intrude over the die to form a good connection with the exposed area of the connector.

Figure 9:
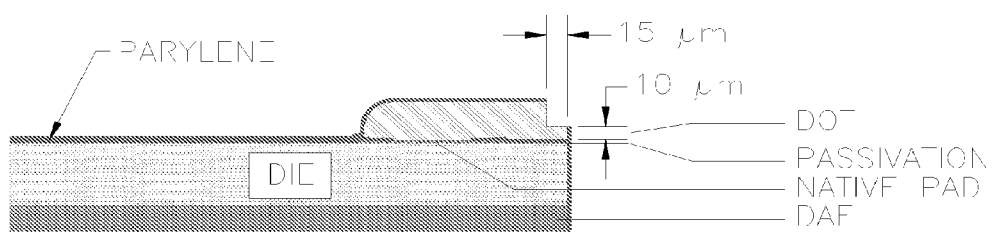
Figure 10:
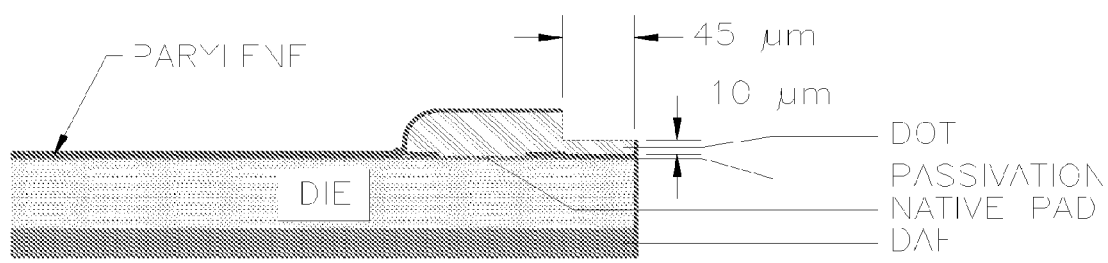
Figure 11:
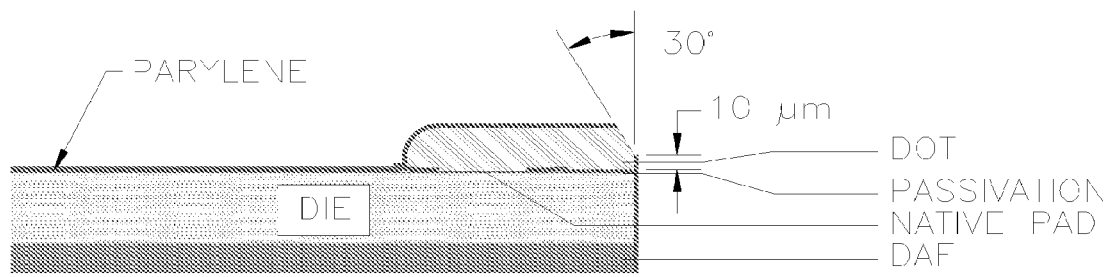

FIGS. 9, 10, 11 are idealized sketches showing die in which a surface of the connector is formed by sawing a notch from the connector neat the die edge. Each of these configurations can be made using a saw such as a dicing saw, by adjustment of the position (inboard of the die edge) and depth of cut appropriately; or by using a saw wheel having a different width and/or diameter. In FIG. 9, for example, the saw is adjusted (or a saw is selected or is deployed for example in a multi-spindle saw apparatus) to form a notch inward to some extent (15 um in the FIG.) from the die edge, and to a depth that leaves a small amount of the connector adjacent the die edge overlying the die surface (to a 10 um thickness in the FIG.). In FIG. 10, for example, the notch is made to a similar depth, leaving a small amount of the connector adjacent the die edge overlying the die surface (to a 10 um thickness in the FIG.), but the notch is wider here, extending inward to a greater extent (45 um in the FIG.); depending upon the particular saw, two or more passes of the saw may be required to provide a notch having this width, but typically a wider saw would be used in a single pass. And in FIG. 11, for example, the saw may be held at an angle (30° in the FIG.) to remove the edge of the connector to form a chamfer; or, instead, a saw designed to form a diagonal cut (for example, a saw having an angled blade, or a V-section wheel) may be used.

Figure 19A:
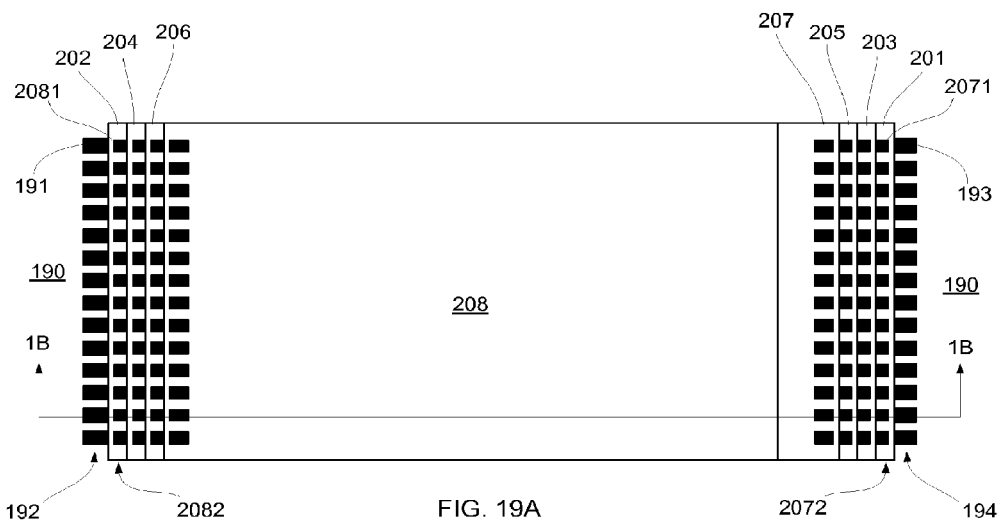
FIG. 19A is a diagrammatic sketch in a plan view showing a stack of die mounted on a substrate, according to another embodiment of the invention.
Figure 19B:
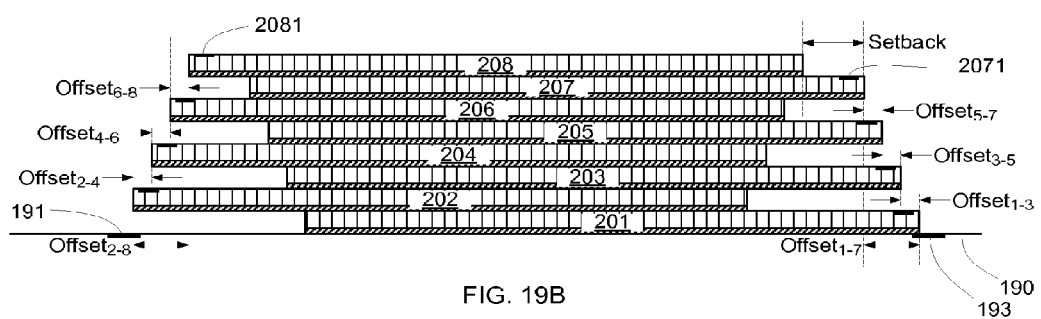
FIG. 19B is a diagrammatic sketch showing an embodiment of an interconnected stacked die assembly in a sectional view as indicated at 1B-1B in FIG. 19A.

As described with reference for example to FIG. 1C, the interconnect sidewalls of the (odd-numbered or even-numbered) die in some "staggered stack" configurations may be vertically aligned. In other "staggered stack" configurations successive overlying (odd-numbered or even-numbered) die may be horizontally offset in relation to die beneath, as shown for example in FIGS. 19A, 19B. Such an arrangement may be referred to as a "pyramid stack" configuration. The pyramid stack shown in these examples is affixed to a mounting surface 190 of a package substrate. Bond pads 193 are arranged in a first row 194, and bond pads 191 are arranged in a second row 192 at the mounting surface of the substrate. The lowermost (odd-numbered) die 201 in the pyramid stack is affixed to the mounting surface of the substrate, positioned such that the interconnect sidewall overlies the first row 194, and such that the die pads (e.g., 2071) in the interconnect margin 2072 are generally aligned with the bond pads 193. The lowermost even-numbered die 202 in the pyramid stack is affixed to the lowermost odd-numbered die, positioned such that the interconnect sidewall overlies the second row 192, and such that the die pads (e.g., 2081) in the interconnect margin 2082 are generally aligned with the bond pads 191. The second odd-numbered die 203 is affixed to the lowermost even-numbered die 202 horizontally offset in relation to the lowermost odd-numbered die 201 as indicated at "Offset$_{1-3}$". Similarly, the second even-numbered die 204 is affixed to the second odd-numbered die 203 horizontally offset in relation to the lowermost even-numbered die 202 as indicated at "Offset$_{2-4}$"; the third odd-numbered die 205 is affixed to the second even-numbered die 204, horizontally offset in relation to the second odd-numbered die 203 as indicated at "Offset$_{3-5}$"; the third even-numbered die 206 is affixed to the third odd-numbered die 205 horizontally offset in relation to the second even-numbered die 204 as indicated at "Offset$_{4-6}$"; the fourth odd-numbered die 207 is affixed to the third even-numbered die 206, horizontally offset in relation to the third odd-numbered die 205, as indicated at "Offset$_{5-7}$"; and the fourth even-numbered die 208 is affixed to the fourth numbered die 207 horizontally offset in relation to the fourth even-numbered die 206 as odd-indicated at "Offset$_{6-8}$". The uppermost (even-numbered) die 208 in the pyramid stack shown here is horizontally displaced in relation to the underlying (odd-numbered) die 207 as indicated at "Setback", to expose the row of pads 2071 in the interconnect margin 2072 of the die 207 for electrical connection.

As the FIGs. show, the footprint of the pyramid stack is somewhat greater than the footprint of a staggered stack of die having the same dimensions. Particularly, the length of the stack footprint exceeds the length of the die by an amount that is the sum of the offsets ("Offset$_{1-7}$"+"Offset$_{2-8}$") and the setback. The rows 192, 194 of bond pads are arranged at a corresponding distance.

Optionally a "dummy" die or other suitable spacer may be interposed (and affixed) between the mounting surface of the substrate and the lowermost die (first odd-numbered die) in the stack. The spacer can be positioned with an offset in the same direction as the offset of the second odd-numbered die, to leave the bond pads beneath the interconnect edge of the lowermost die uncovered. Experience suggests that providing a greater bond pad area for contact with the Z-interconnect material can provide a more robust connection there.

The offsets in the pyramid stack configuration provide for improved access to the pads during formation of the Z-interconnects, as compared with the staggered stack configuration, as there is no requirement (or at least a reduced requirement) in the pyramid stack for the Z-interconnect material to intrude beneath an overlying die to access the pads on an underlying die.

The extents of the offsets in the illustrated example are shown as being the same, and the setback is shown as being greater than the offsets. As will be appreciated, the drawings are not to scale, and the relative dimensions of these features need not conform to the illustration. Other arrangements are contemplated. For example, the setback need not be greater than any of the offsets. And, for example, the offsets need not be the same, nor even approximately the same. And, for example, the offsets of the odd-numbered die may all be the same or approximately the same, but different from the offsets of the even-numbered die. Or, for example, the offsets may be progressively greater or less upward the stack. In some examples the offsets may be in the range about 20 um to about 100 um; in particular examples where the offsets are about equal, they may be about 25 um, or about 40 um, or about 50 um (and in such examples the corresponding "Offset$_{1-7}$" and "Offset$_{2-8}$" would be about 75 um, or about 120 um, or about 50 um).

In some examples the setback may be about the same as one or more of the offsets, or it may be greater, to as much as about 250 um or more, for example. The amount of overhang of the die depends upon the extent of the setback and of the offsets. As may be appreciated, where the die are thin (for example 10 um or less), they may tend to flex, and the flex may be substantial if the overhang is greater. This may set a practical limit on the extent of the setback and of the offsets.

FIG. 20A shows a pyramid stack 200 in a sectional view; and FIG. 20B shows in partial sectional views (as indicated at $B_L$ and $B_R$ in FIG. 20A) Z-interconnection of the die in the stack and of the stack to a substrate. The pyramid configuration shown in this example is similar to that of FIGS. 19A, 19B. Many features of the Z-interconnection in this pyramid stack are similar to features of the stagger stack as shown in FIG. 6, and for clarity of presentation some details are not replicated here.

Here, as in the stagger stack, each die has a front ("active") side, in which the die circuitry is formed. Die pads (e.g., 2027) are situated in the interconnect margin at the front surface of each die. The back side of each die is provided with a die attach film (DAF), for example 2047. A connector (e.g., 2057) is formed in contact with each die pad (e.g., 2027); in the example shown the connectors are blobs of electrically conductive material. Various surfaces of the die are covered by, and insulated by, one or more layers of parylene. Openings in the parylene expose portions of the die pads, and portions of selected connectors. Die in the stack are electrically interconnected and connected to the substrate by way of the Z-interconnect 2097, which contacts the bond pad (e.g., 2092) and the exposed area of connector 2057. As will be appreciated, openings may be made over selected connectors, with the result that non-selected connectors will not contact the Z-interconnect, and electrical connection of the die pad underlying the non-selected connector will be avoided.

In any stack configuration, depending upon properties of the uncured Z-interconnect material, the deposited material at the uppermost connector (that is, the connector on the uppermost die in the stack) may tend to slump to one side or another off the connector. If the material slumps too far, and particularly if the material slumps off a first connector toward a second connector (on the same die) and off the second connector toward the first connector (on the same die), contact between the Z-interconnects may result, leading to an electrical short. Accordingly, the connectors may be omitted from the uppermost die.

Other embodiments are within the claims.

For example, the invention provides die prepared for z-interconnection and stacking in any of a variety of stacking configurations. The connectors described herein may be employed, for example, in a vertically aligned or offset die stack in which the die are not spaced apart; or, for example, in a die stack in which die are spaced apart using spacers other than active die.

And, for example, the connectors may be formed of spots of curable electrically conductive material, as described above; or, alternatively, the connector may be a conductive metal trace or metallization, for example a gold trace extending from the die pad toward the die edge. Such a metal trace may be formed by plating or sputtering, for example. Certain Z-interconnect materials suitable for aerosol spray application may make better electrical connection with a gold trace, for example, than with a cured spot of curable material. Alternatively, where it may be desirable to omit bump- or spot-shaped connectors from the uppermost die as noted above, a metal trace connector may be employed.

And, for example, the assemblies may include any desired number of die.

We claim:

1. A method for forming a connector on a die pad at a wafer level of processing, comprising
    forming a channel defining an interconnect die edge of a first die of the wafer and an adjacent edge of a second die of the wafer, wherein the interconnect die edge of the first die, the edge of the second die, and the channel therebetween have longest dimensions extending in a first direction, and a width of the channel extends in a second direction from the interconnect die edge to the adjacent edge of the second die;
    forming an electrically insulative material overlying a front surface of the wafer, the interconnect die edge, and the edge of the second die, the insulative material spanning an entire width of the channel;
    forming spots of a curable electrically conductive material over die pads and extending over an interconnect die edge above the channel;
    curing the conductive material; and
    in a wafer cutting procedure thereafter severing the spots.

2. The method of claim 1, wherein the electrically insulative material is formed such that the die pads are exposed within openings in the electrically insulative material.

3. The method of claim 1, wherein the spots are formed so as to span the entire width of the channel.

4. The method of claim 1, wherein the spots are formed such that the spots do not span the entire width of the channel.

5. The method of claim 1, such that the severed spots overhang the interconnect die edge.

6. The method of claim 1, wherein the channel is a first channel, and the wafer cutting procedure forms a second channel which is narrower than the first channel.

7. The method of claim 1, further comprising thinning the wafer subsequent to forming the channel.

8. The method of claim 7, wherein the channel is formed to a depth greater than an eventual thickness of the die and less than a full wafer thickness prior to the thinning.

9. The method of claim 7, further comprising applying a die attach film to the wafer after the thinning.

10. The method of claim 9, further comprising cutting through the spots and die attach film.

11. A method for preparing a die for stacking and electrical connection, comprising:
    performing a first wafer cutting procedure along first saw streets, thereby forming channels defining interconnect die edges of first die and adjacent edges of second die of a wafer, wherein each interconnect die edge, each adjacent edge of the second die, and each channel therebetween has a longest dimension extending in a first direction, and a width of each channel extends in a second direction from the interconnect die edge of a first die to the adjacent edge of a second die;
    forming an electrically insulative material overlying a front surface of the wafer, the interconnect die edges, and the adjacent edges of the second die adjacent thereto, the insulative material spanning an entire width of each channel;

forming spots of an electrically conductive material over die pads and extending in a direction parallel to a front surface of the wafer beyond an interconnect die edge; and in a second wafer cutting procedure thereafter severing the spots.

12. The method of claim 11 wherein the second wafer cutting procedure forms narrower channels than the first wafer cutting procedure.

13. The method of claim 11, further comprising thinning the wafer subsequent to carrying out the first wafer cutting procedure.

14. The method of claim 11 wherein the first wafer cutting procedure is made to a depth greater than the eventual die thickness and less than the full wafer thickness, forming interconnect sidewalls.

15. The method of claim 11, wherein the spots bridge the channel prior to being severed, and after being severed the spots include overhang portions extending beyond the interconnect die edge.

16. The method of claim 11, wherein the severed spots include overhang portions extending beyond a surface of the electrically insulative material.

17. The method of claim 11, wherein the spots are formed such that the spots do not span the entire width of the channel.

18. The method of claim 11, such that the severed spots overhang the interconnect die edge.

\* \* \* \* \*